(12) United States Patent
Whitesides et al.

(10) Patent No.: US 6,180,239 B1
(45) Date of Patent: *Jan. 30, 2001

(54) MICROCONTACT PRINTING ON SURFACES AND DERIVATIVE ARTICLES

(75) Inventors: George M. Whitesides, Newton; Younan Xia, Cambridge, both of MA (US); James L. Wilbur, Germantown, MD (US); Rebecca J. Jackman; Enoch Kim, both of Boston, MA (US); Mara G. Prentiss, Cambridge, MA (US); Milan Mrksich, Chicago, IL (US); Amit Kumar, MilPitas, CA (US); Christopher B. Gorman, Raleigh, NC (US); Hans Biebuyck, Thalwil (CH); Karl K. Berggren, Cambridge, MA (US)

(73) Assignee: President and Fellows of Harvard College, Cambridge, MA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/676,951

(22) Filed: Jul. 8, 1996

Related U.S. Application Data

(63) Continuation-in-part of application No. 08/397,635, filed on Mar. 1, 1995, now abandoned, which is a continuation-in-part of application No. 08/131,841, filed on Oct. 4, 1993, now Pat. No. 5,512,131.

(51) Int. Cl.⁷ .................. B32B 9/04; B41L 42/02
(52) U.S. Cl. ............... 428/411.1; 428/195; 101/368; 101/378; 101/379
(58) Field of Search .................. 428/411.1, 195; 101/368, 376, 378, 379

(56) References Cited

U.S. PATENT DOCUMENTS

| Re. 33,581 | 4/1991 | Nicoli et al. ............... 435/7.2 |
| 2,905,539 | 9/1959 | Bowerman ............... 174/250 |

(List continued on next page.)

FOREIGN PATENT DOCUMENTS

| 58-150148 | 9/1983 | (JP) ............... G11B/7/26 |
| 2140702 | 5/1990 | (JP) ............... G02B/5/08 |

(List continued on next page.)

OTHER PUBLICATIONS

T.P. Moffat et al., "Patterned Metal Electrodeposition Using an Alkanethiolate Mask", J. Electrochem. Soc., vol. 142, No. 11, Nov. 1995.

(List continued on next page.)

*Primary Examiner*—Mark Chapman
(74) *Attorney, Agent, or Firm*—Wolf, Greenfield & Sacks, P.C.

(57) ABSTRACT

Improved method of forming a patterned self-assembled monolayer on a surface and derivative articles are provided. According to one method, an elastomeric stamp is deformed during and/or prior to using the stamp to print a self-assembled molecular monolayer on a surface. According to another method, during monolayer printing the surface is contacted with a liquid that is immiscible with the molecular monolayer-forming species to effect controlled reactive spreading of the monolayer on the surface. Methods of printing self-assembled molecular monolayers on nonplanar surfaces and derivative articles are provided, as are methods of etching surfaces patterned with self-assembled monolayers, including methods of etching silicon. Optical elements including flexible diffraction gratings, mirrors, and lenses are provided, as are methods for forming optical devices and other articles using lithographic molding. A method for controlling the shape of a liquid on the surface of an article is provided, involving applying the liquid to a self-assembled monolayer on the surface, and controlling the electrical potential of the surface.

41 Claims, 13 Drawing Sheets

U.S. PATENT DOCUMENTS

| | | | |
|---|---|---|---|
| 3,497,377 | 2/1970 | Allingham | 428/332 |
| 3,641,354 | 2/1972 | DeMent | 250/216 |
| 3,716,359 | 2/1973 | Sheridon | 430/19 |
| 4,011,009 | 3/1977 | Lama et al. | 359/571 |
| 4,173,075 | 11/1979 | Stewart | 33/23.11 |
| 4,274,706 | 6/1981 | Tangonan | 385/37 |
| 4,325,779 | 4/1982 | Rossetti | 216/44 |
| 4,330,175 | 5/1982 | Fujii et al. | 359/571 |
| 4,382,657 | 5/1983 | Lemaitre | 359/846 |
| 4,477,158 | 10/1984 | Pollock et al. | 351/169 |
| 4,512,848 | 4/1985 | Deckman et al. | 216/43 |
| 4,528,260 | 7/1985 | Kane | 430/321 |
| 4,582,566 | 4/1986 | Grey | 216/44 |
| 4,587,213 | 5/1986 | Malecki | 435/39 |
| 4,690,715 | 9/1987 | Allara et al. | 148/252 |
| 4,728,591 | 3/1988 | Clark et al. | 430/5 |
| 4,731,155 | 3/1988 | Napoli et al. | 156/643 |
| 4,802,951 | 2/1989 | Clark et al. | 216/56 |
| 4,818,336 | 4/1989 | Rossetti | 216/44 |
| 4,842,633 | 6/1989 | Kuribayashi et al. | 65/44 |
| 4,897,325 | 1/1990 | Akkapeddi et al. | 430/5 |
| 4,999,489 | 3/1991 | Huggins | 250/226 |
| 5,018,829 | 5/1991 | Ogawa | 385/141 |
| 5,020,879 | 6/1991 | Kuzuta et al. | 359/573 |
| 5,032,216 | 7/1991 | Felten | 216/87 |
| 5,079,600 | 1/1992 | Schnur et al. | 257/750 |
| 5,143,854 | 9/1992 | Pirrung et al. | 436/518 |
| 5,202,227 | 4/1993 | Matsuda et al. | 430/320 |
| 5,255,273 | 10/1993 | Nilsson et al. | 372/20 |
| 5,259,926 | 11/1993 | Kuwabara et al. | 216/54 |
| 5,294,369 | 3/1994 | Shigekawa et al. | 252/313.1 |
| 5,315,436 | 5/1994 | Lowenhar et al. | 359/569 |
| 5,512,131 | 4/1996 | Kumar et al. | 438/738 |
| 5,648,201 | * 7/1997 | Dulcey et al. | 430/324 |
| 5,951,881 | 9/1999 | Rogers et al. | 216/41 |
| 5,976,826 | 11/1999 | Singhvi et al. | 435/29 |

FOREIGN PATENT DOCUMENTS

| | | | |
|---|---|---|---|
| 2165933 | 6/1990 | (JP) | B29D/11/00 |
| 2210302 | 8/1990 | (JP) | G02B/5/10 |
| WO 95/12480 | 5/1995 | (WO) | B29C/37/00 |
| WO 97/07429 | 2/1997 | (WO) | G03F/7/00 |

OTHER PUBLICATIONS

J.K. Schoer et al., "Scanning Probe Lithography", Langmuir, vol. 10, No. 3, pp. 615–618, 1994. (Abstract).

E.A. Dobisz et al., "Self–Assembled Monolayer Films for Nanofabrication", Mat. Res. Soc. Symp. Proc., vol. 380, 1995.

Kim et al., Combining Patterned Self–Assembled Monolayers of Alkanethiolates on Gold with Anisotropic Etching of Silicon to Generate Controlled Surface Morphologies, J. Electrochem. Soc. 142(2), pp. 628–633 (Feb., 1995).

Labinis et al., "Comparison of the Structures and Wetting Properties of Self–Assembled Monolayers of n–Alkanethiols on the Coinage Metal Surfaces, Cu, Ag, Au$^{1*}$", Amer. Chem. Soc. 113(19), pp. 7152–7167 (Jan. 14, 1991).

Kleinfeld et al., "Controlled Outgrowth of Dissociated Neurons on Patterned Substrates", Journal of Neuroscience, 8, pp. 4098–4120 (Nov., 1988).

Lopez et al., "Convenient Methods for Patterning the Adhesion of Mammalian Cells to Surfaces Using Self–Assemblied Monolayers of Alkanethiolates on Gold", Amer. Chemical Society 115, pp. 5877–5878 (Feb. 22, 1993).

Dulcey et al., "Deep UV Photochemistry of Chemisorbed Monolayers: Patterned Coplanar Molecular Assemblies", Science 252, pp. 551–554 (Apr. 26, 1991).

Jacobsen et al., "Design, Analysis, and Experimental Results for the Wobble Motor: An Eccentric–Motion Electrostatic Microactuator", SPIE 1167, pp. 122–136 (1989).

Matsuda et al., "Development of Micropatterning Technology for Cultured Cells", Trans. Am. Soc. Artif. Intern Organs 36 (1990).

Singhvi et al., "Engineering Cell Shape and Function", Science 264, p.696 (Apr. 29, 1994).

Jacobsen et al., "Fabrication of Micro–Structures Using Non–Planar Lithography (NPL)", Proceedings, IEEE Micro Electro Mechanical Systems, An Investigation of Micro Structures, Sensors, Actuators, Machines and Robots, Nara, Japan, Jan. 30–Feb. 2, 1991.

Westermark, B., "Growth Control in Miniclones of Human Glial Cells", Exper. Cell Res. 111, pp. 295–299 (Feb. 15, 1978).

Lopez et al., "Imaging of Features on Surfaces by Condensation Figures", Science 260, pp. 647–649 (Apr. 30, 1993).

Parikh et al., "An Intrinsic Relationship Between Molecular Structure in Self–Assembled n–Alkylsiloxane Monolayers and Deposition Temperature", J. Phys. Chem., May 3, 1995, vol. 98, No. 31, pp. 7577–7590.

Ireland et al., "Limitation of Substratum Size Alters Cyto–Skeletal Organization and Behaviour of Swiss 3T3 Fibroblasts", Cell Bio. Int'l Reports 13, pp. 781–790 (Sep., 1989).

Abbott et al., "Manipulation of the Wettability of Surfaces on the 0.1– to 1–Micrometer Scale Through Micromachining and Molecular Self–Assembly", Science 257, pp. 1380–1382 (Sep. 4, 1992).

Britland et al., "Micropatterned Substratum Adhesiveness: A Model for Morphogenetic Cues Controlling Cell Behavior", Exper. Cell Research 198, pp. 124–129 (Jan. 20, 1992).

Spinke et al., "Molecular Recognition at Self–Assembled Monolayers: Optimization of Surface Functionalization", J. Chem. Phys., vol. 99, No. 9, pp. 7012–7019, Nov. 1, 1993.

Vargo et al., "Monolayer Chem. Lithography and Characterization of Fluoropolymer Films", Langmuir 8, pp. 130–134 (Jan. 20, 1992).

O'Neill et al., "Narrow Linear Strips of Adhesive Substratum are Powerful Inducers of Both Growth and Focal Contact Area", Cell Science 95, pp. 577–586 (Jan. 2, 1990).

Kumar et al., "Patterning Self–Assembled Monolayers: Applications in Materials Science", Langmuir 10, pp. 1498–1511 (May 20, 1994).

Abbott et al., "Potential–Dependent Wetting of Aqueous Solutions on Self–Assembled Monolayers Formed from 15–(Ferrocenylcarbonyl)pentadecanethiol on Gold", Langmuir 10, pp. 1493–1497, May 20, 1994.

Ponten et al., "Proliferation Control in Cloned Normal and Malignant Human Cells", Exper. Cell Research, pp. 367–375 (May 12, 1980).

McGovern et al., "Role of Solvent on the Silanization of Glass with Octadecyltrichlorosilane", Langmuir, Jun. 20, 1994, vol. 10, No. 10, pp. 3607–3614.

Cromie, "Self–Assembling Molecules Manipulated by Chemists", Harvard's Gazette (Jul. 9, 1993).

Tiberio et al., "Self–Assembled Monolayer Electron Beam Resist on GaAs", Anal. Phys. Lett., Feb. 1, 1993.

Biebuyck et al., "Self-Organization of Organic Liquids on Patterned Self-Assembled Monolayers of Alkanethiolates on Gold", Langmuir 10, pp. 2790–2793 (Mar. 14, 1994).

Huber et al., "Toroidal grating obtained on an elastic substrate", Applied Optics 20(12), pp. 2139–2142, Jun. 15, 1981.

Gorman et al., "Use of a Patterned Self–Assembled Monolayer to Control the Formation of a Liquid Resist Pattern on a Gold Surface", Chem. Mater. 7, pp. 252–254 (Feb. 15, 1995).

Kumar et al., "The Use of Self–Assembled Monolayers and a Selective Etch to Generate Patterned Gold Features", Amer. Chem. Society 14, pp. 9188–9189 (Nov. 4, 1992).

Tarlov et al., "UV Photopatterning of Alkanethiolate Monolayers Self–Assembied on Gold and Silver", Am. Chem. Soc. 115 (Apr. 13, 1993).

Whitesides et al., "Wet Chemical Approaches to the Characterization of Organic Surfaces: Self–Assembled Monolayers, Wetting, and the Physical–Organic Chemistry of the Solid–Liquid Interface", Langmuir 6, pp. 87–96 (Jan. 31, 1990).

Jacobsen et al., "The Wobble Motor: Design Fabrication and Testing of an Eccentric–Motion Electrostatic Microactuator", IEEE, pp. 1536–1546, (1989).

Amit Kumar, et al., "Patterning Self–Assembled Monolayers: Applications in Materials Science", American Chemical Society, Langmuir Vo. 10, No. 5 (1994), pp. 1498–1511.

Wilbur, et al., "Microfabrication of Microcontact Printing of Self–Assembled Monolayers", Advanced Materials, Research News, Adv. Mater. (1994) 6, No. 7/8, pp. 600–604.

Christopher B. Gorman et al., "Fabrication of Patterned, Electrically Conducting Polypyrrole Using a Self–Assembled Monolayer: A Route to All–Organic Circuits", Chem. Mater., vol. 7, No. 3, pp. 526–529 (1995).

Nicholas L. Abbott et al., "Active Control of Wetting Using Applied Electrical Potentials and Self–Assembled Monolayers", Langmuir, vol. 11, No. 1, pp. 16–18 (1995).

Christopher B. Gorman et al., "Control of the Shape of Liquid Lenses on a Modified Gold Surface Using an Applied Electrical Potential across a Self–Assembled Monolayer", Langmuir, vol. 11, No. 6, pp. 2242–2246 (1995).

Jeffrey M. Calvert et al., "Deep ultraviolet patterning of monlayer films for high resolution lithography", J. Vac. Sci. Technol. B. vol. 9, No. 6, pp. 3447–3450 (1991).

Jeffrey M. Calvert et al., "New Surface Imaging Techniques for Sub–0.5 Micrometer Optical Lithography", Solid State Technology, pp. 77–82 (1991).

Jeffrey M. Calvert et al., "Deep Ultraviolet Lithography of Monolayer Films with Selective Electroless Metallization", J. Electrochem. Soc., vol. 139, No. 6, pp. 1677–1680 (Jun. 1992).

Suresh K. Bhatia et al., "Fabrication of Surfaces Resistant to Protein Adsorption and Application to Two–Dimensional Protein Patterning", Anal. Biochem., vol. 208, pp. 197–205 (1993).

David A. Stenger, "Coplanar Molecular Assemblies of Amino– and Perfluorinated Alkylsilanes: Characterization and Geometric Definition of Mammalian Cell Adhesion and Growth", J. Am. Chem. Soc., vol. 114, No. 22, pp. 8435–8442 (1992).

Walter J. Dressick et al., "Photopatterning and Selective Electroless Metallization of Surface–Attached Ligands", Chem. Mater., vol. 5, No. 2, pp. 148–150 (1993).

Timothy S. Koloski et al., "Nucleophilic Displacement Reactions at Benzyl Halide Self–Assembled Monolayer Film Surfaces", Langmuir, vol. 10, No. 9, pp. 3122–3133 (1994).

Stephen J. Potochnik et al., "Selective Copper Chemical Vapor Deposition Using Pd–Activated Organosilane Films", Langmuir, vol. 11, No. 6, pp. 1841–1845 (Jun. 1995).

M. A. Hartney et al., "Silylation of focused ion beam exposed resists", Appl. Phys. Lett., vol. 59, No. 4, pp. 485–487 (1991).

Nobuyuki Ichinose, "Immobilization of Protein on Micropatterns by the Use of Photoremovable Activated Ester", Chemistry Letters, pp. 237–238 (1995).

Doris Kang et al., "Patterned Functionalization of Gold and Single Crystal Silicon via Photochemical Reaction of Surface–Confined Derivatives of $(n^5-C_5H_5)Mn(CO)_3$", Langmuir, vol. 7, No. 10, pp. 2169–2174 (1991).

M. J. Lercel et al., "Pattern transfer of electron beam modified self–assembled monolayers for high–resolution lithography", J. Vac. Sci. Tecnol. B. vol. 13, No. 3, pp. 1139–1143 (1995).

David John Pritchard et al., "Micron–Scale Patterning of Biological Molecules", Angew. Chem. Int. Ed. Engl., vol. 34, No. 1, pp. 91–93 (1995).

Lawrence F. Rozsnyai et al., "Selective Electrochemical Deposition of Polyaniline via Photopatterning of a Monolayer–Modified Substrate", J. Am. Chem. Soc., vol. 116, No. 13, pp. 5993–5994 (1994).

J.A.M. Sondag–Huethorst et al., "Generation of electrochemically deposited metal patterns by means of electron beam (nano)lithography of self–assembled monolayer resists", Appl. Phys. Lett., vol. 64, No. 3, pp. 285–287 (Jan. 1994).

Eric W. Wollman et al., "Scanning Electron Microscopy for Imaging Photopatterned Self–Assembled Monolayers on Gold", Langmuir, vol. 9, No. 6, pp. 1517–1520 (1993).

Eric W. Wollman et al., "Photosensitive Self–Assembled Monolayers on Gold: Photochemistry of Surface–Confined Aryl Azide and Cyclopentadienylmanganese Tricarbonyl", J. Am. Chem. Soc., vol. 116, No. 10, pp. 4395–4404 (1994).

Amit Kumar et al., "Features of gold having micrometer to centimeter dimensions can be formed through a combination of stamping with an elastomeric stamp and an alkanethiol 'ink' followed by chemical etching", Appl. Phys. Lett., vol. 63, No. 14, pp. 2002–2004 (1993).

Younan Xia et al., "Microcontact Printing of Octadecylsiloxane on the Surface of Silicon Dioxide and Its Application in Microfabrication", Langmuir, pp. 9576–9578 (1995).

M.C.E. Huber et al., "Toroidal grating obtained on an elastic substrate", Applied Optics, vol. 20, No. 12, pp. 2139–2142 (Jun. 1991).

Brockway et al. "Electron Microscopic Investigation of the Adsorption of Long Chain Fatty Acid Monolayers on Glass" pp. 275–294, 1963.*

Briscoe et al. "The Shear Properties of Langmuir–Blodgett Layers", pp. 389–407, 1982.*

* cited by examiner

TIME (MIN.)
1st    2nd
PRINTING/PRINTING
0.5/0.5

TIME (MIN.)
1st    2nd
PRINTING/PRINTING
4/4

TIME (MIN.)
1st    2nd
PRINTING/PRINTING
10/10

TIME (MIN.)
1st    2nd
PRINTING/PRINTING
5/0.5

TIME (MIN.)
1st    2nd
PRINTING/PRINTING
10/0.5

10μm

MICROCONTACT PRINTING ON SURFACES AND DERIVATIVE ARTICLES

RELATED APPLICATION

This application is a continuation-in-part of U.S. application Ser. No. 08/397,635, filed Mar. 1, 1995, now abandoned, which is a continuation-in-part of U.S. application Ser. No. 08/131,841, filed Oct. 4, 1993, now U.S. Pat. No. 5,512,131, issued Apr. 30, 1996.

This invention was made with government support from NIH Grant Number GM30367 and ONR Grant N00014-86-K0756. The government has certain rights in the invention.

FIELD OF THE INVENTION

The present invention relates generally to derivatization and patterning of surfaces and more particularly to the formation of self-assembled molecular monolayers on surfaces using microcontact printing, derivative articles produced thereby, and novel optical elements.

BACKGROUND OF THE INVENTION

In fields involving microelectronic devices, sensors, and optical elements, the development of devices that are small relative to the state of the art, controllable, and conveniently and relatively inexpensively reproduced with a relatively low failure rate is important.

A well-known method of production of such devices is photolithography. According to this technique, a negative or positive resist (photoresist) is coated onto the exposed surface of a material. The resist then is irradiated in a predetermined pattern, and irradiated (positive resist) or nonirradiated (negative resist) portions of the resist are washed from the surface to produce a predetermined pattern of resist on the surface. This is followed by one or more procedures. For example, the resist may serve as a mask in an etching process in which areas of the material not covered by resist are chemically removed, followed by removal of resist to expose a predetermined pattern of the conducting, insulating, or semiconducting material on the substrate. According to another example, the patterned surface is exposed to a plating medium or to metal deposition under vacuum, followed by removal of resist, resulting in a predetermined plated pattern on the surface of the material. In addition to photolithography, x-ray and electron-beam lithography have found analogous use.

While the above-described irradiative lithographic methods may be advantageous in many circumstances, all require relatively sophisticated and expensive apparatus to reproduce a particular pattern on a plurality of substrates, and are relatively time-consuming. Additionally, no method of patterning nonplanar surfaces is commonly available according to these methods. In the field of electronic circuitry, an attempt is often made to save space by stacking planar circuit boards or chips, the boards or chips interconnected with auxiliary contacts. Alternately, a board or chip may be bent or otherwise formed in a nonplanar manner so as to save space, auxiliary contacts connecting components on different sides of the bend. All too often these auxiliary contacts are the cause of circuitry failure, and the attempt to move from the two-dimensional domain to a three-dimensional domain fails. Irradiative lithography provides no remedy to this complication, nor does it provide a method of conveniently and inexpensively reproducing an existing microelectronic circuit pattern, or the surface morphological features of other objects of interest.

Additionally, the above-described irradiative techniques are generally not amenable to the patterning of biological species such as proteins, as they typically utilize resists and solvents that are toxic to many biological species.

A need exists in the art for a convenient, inexpensive, and reproducible method of plating or etching a surface according to a predetermined pattern. The method would ideally find use on planar or nonplanar surfaces, and would result in patterns having features in the micron and submicron domain. Additionally, the method would ideally provide for convenient reproduction of existing patterns. Additionally, a need exists for the fabrication of surfaces that can pattern portions amenable to attachment of biological species, such as antibodies, antigens, proteins, cells, etc., on the micrometer scale.

The study of self-assembled monolayers (SAMs) is an area of significant scientific research. Such monolayers are typically formed of molecules each having a functional group that selectively attaches to a particular surface, the remainder of each molecule interacting with neighboring molecules in the monolayer to form a relatively ordered array. Such SAMs have been formed on a variety of substrates including metals, silicon dioxide, gallium arsenide, and others. SAMs have been applied to surfaces in predetermined patterns in a variety of ways including simple flooding of a surface and more sophisticated methods such as irradiative patterning.

Accordingly, a general purpose of the present invention is to solve problems associated with expense, complicated apparatus, and other complications associated with patterning surfaces for electronic, chemical, biological, and optical devices. One object is to provide a method of conveniently and reproducibly producing a variety of SAM patterns on planar and nonplanar surfaces, the patterns having resolution in the submicron domain, and being amenable to plating, etc. Another purpose of the invention is to facilitate the attachment of biomolecules on the submicron scale without loss of biological function. Another purpose of the invention is to provide a method of forming a template from an existing pattern having micron or submicron-domain features, the template conveniently reproducing the preexisting pattern.

Another general purpose of the invention is to provide optical elements and devices that are conveniently and inexpensively manufactured, and that are adaptable to a variety of systems.

SUMMARY OF THE INVENTION

The present invention provides a method of etching an article that is coated with a thin layer of resist. The method involves contacting a first portion of the resist surface with a stamp to transfer to the first portion a self-assembled monolayer of a molecular species in a first pattern. The self-assembled monolayer is contiguous with an exposed portion of the resist surface in a second pattern. The resist is removed from the surface of the article, according to the second pattern, by contacting the exposed portion of the resist surface with a first etchant that reacts chemically with the resist and that is inert with respect to the self-assembled monolayer. This exposes the surface of the article in the second pattern. A second etchant is applied to the exposed surface of the article that reacts chemically with the article and that is inert with respect to the resist. According to one aspect the resist is an electrical conductor. According to another, the resist is a metal oxide, and can be an oxide of the article. The article can be a semiconductor such as silicon gallium arsenide, or the like, and can have a nonplanar surface.

According to one embodiment, the self-assembled monolayer exposes a chemical functionality in the first pattern, and prior to the removing the resist, the molecular species is coated with a protecting species that is compatible with the chemical functionality and incompatible with the first etchant.

The present invention provides also a method of etching an article involving contacting a first portion of the surface of the article with a stamp to transfer to the first portion a self-assembled monolayer of a molecular species in a first pattern, the self-assembled monolayer being contiguous with an exposed portion of the surface in a second pattern and exposing a chemical functionality. A protecting species that is compatible with the chemical functionality is applied to the self-assembled monolayer, and the exposed portion of the surface is contacted with an etchant that reacts chemically with the resist and that is incompatible with the protecting species. According to another embodiment, the self-assembled monolayer exposes a chemical functionality, in the first pattern, that is less compatible with the protecting species than is the surface of the article that remains uncovered with the self-assembled monolayer. In this embodiment, the protecting species is positioned on the surface at regions not covered by the self-assembled monolayer and, when the etchant is applied, the etchant etches the article at regions not covered by the protecting species (including those regions originally covered by the self-assembled monolayer).

The present invention provides also a method of applying to a surface of an article a self-assembled monolayer of a molecular species. The method involves coating a portion of a stamping surface of a stamp with a self-assembled monolayer-forming molecular species, and transferring from the stamping surface to a first portion of the article surface the molecular species, while applying to a second portion of the article surface contiguous with the first portion a species that is not compatible with the molecular species. According to one aspect the method involves allowing the molecular species to spread evenly from the first portion of the article surface to the second portion of the article surface. According to another aspect the first portion of the article surface includes at least two isolated regions separated by the second portion, and the method involves transferring the molecular species from the stamping surface to the at least two isolated regions of the first portion, while applying to a second portion the species that is not compatible with the molecular species. The molecular species is allowed to spread from each of the at least two isolated regions of the first portion toward each other. The molecular species can be lipophilic and the species that is not compatible with the molecular species hydrophilic, or vice versa, and the article surface can be nonplanar. Prior to or during the transferring step the stamp can be deformed.

The present invention also provides a method involving applying to a surface of an article a first region and a second region of a self-assembled monolayer, where the first and the second regions are separated from each other by an intervening region. A species that is incompatible with the molecular species that forms the self-assembled monolayer is applied to the intervening region, and the molecular species is allowed to spread evenly from the first region toward the second region and from the second region toward the first region.

The present invention also provides a method of applying to a surface of an article a self-assembled monolayer of a molecular species. The method involves coating a portion of a stamping surface of a flexible stamp with a self-assembled monolayer-forming molecular species, deforming the stamp, and contacting at least a portion of the surface with at least a portion of the stamping surface. The stamp can be deformed by compressing it in a plane approximately parallel to the stamping surface, and/or by applying a force to it in a direction approximately perpendicular to the stamping surface.

The present invention also provides a method of making an article, involving etching a pattern into a surface of a template, and molding the article on the surface of the template. This can involve applying to the template a hardenable fluid and allowing the fluid to harden. For example, a prepolymeric fluid can be applied to the template and polymerized. According to one aspect, the hardenable fluid is a fluid precursor of an elastomer. The etching can be anisotropic etching.

The present invention also provides a method of making an article that involves providing a template having a surface anisotropically etched in a pattern, applying a hardenable fluid to the surface, and allowing the fluid to harden.

The present invention also provides a method of patterning a self-assembled monolayer on a nonplanar surface of an article. The method involves rolling the nonplanar surface of the article over a stamping surface of a stamp carrying a self-assembled monolayer-forming molecular species, thereby transferring to the nonplanar surface a self-assembled monolayer of the molecular species. According to one aspect, the rolling step involves applying to the nonplanar surface the self-assembled monolayer in a pattern, while leaving portions of the surface contiguous with the self-assembled monolayer exposed. According to one aspect the exposed portions of the surface are etched.

The present invention also provides a method of making a lens, involving providing a hardenable fluid precursor of the lens, contacting a surface of the fluid precursor with a liquid that is incompatible with the fluid precursor, and allowing the fluid precursor to harden to form a lens. The precursor can be a prepolymeric fluid, and can be a precursor of an elastomer.

The present invention also provides a method of making an article, involving providing a supporting surface having, on a discrete isolated region, a self-assembled monolayer of a molecular species, applying to the self-assembled monolayer a fluid precursor of the article, the precursor having a surface including a first region in contact with the self-assembled monolayer and a second, exposed region contiguous with the first region, contacting the exposed region of the precursor surface with a fluid that is incompatible with the precursor fluid, and allowing the precursor to harden.

The present invention also provides a method of making a diffraction grating, involving coating a surface of a template with a hardenable, fluid diffraction grating precursor, allowing the fluid precursor to harden and form a diffraction grating, and removing the diffraction grating from the template.

The present invention also provides a method of making an optical element, involving molding an article by coating a mold having an optical surface with a hardenable fluid and allowing the fluid to harden to form an article having an optical surface that correlates to the optical surface of the mold, removing the article from the mold, and contacting the optical surface of the article with a liquid metal.

The present invention also provides articles made by the above and other methods, including an article including on its surface an isolated region of a self-assembled monolayer of a molecular species, the isolated region including a lateral dimension of less than 10 microns. Preferably, the dimension is less than 5 microns, more preferably less than 1 micron, more preferably less than 0.5 micron, more preferably less than 0.25 micron, more preferably less than 0.2 micron, more preferably less than 0.15 micron, and most preferably less than 0.1 micron. Also provided is a device including on its surface an pattern of a self-assembled monolayer of a molecular species, the pattern having a lateral dimension of less than 10 microns, or one of the other preferred dimensions above. Also provided is a device including on its surface an pattern of a self-assembled monolayer of a molecular species, the pattern including two closely-spaced regions of a single self-assembled monolayer, or closely-spaced different self-assembled monolayers, the dimension between them being less than 10 microns, or one of the other preferred dimensions above.

The present invention also provides a diffraction grating including a liquid metal having a surface that is in contact with and correlates to a surface of an article. The article surface correlates to an diffraction grating, and the liquid metal surface is formed thereby into a diffraction grating. The grating can be transparent and flexible, preferably transparent and elastomeric.

The present invention also provides an optical element including an elastomer including a void having an optical convex or concave surface, and a liquid metal adjacent the convex or concave surface of the void. Preferably, the liquid metal fills the void and is encapsulated by the elastomer.

The present invention also provides a device including an article defining a surface, a first and a second isolated region of a self-assembled monolayer on the surface, the first and second regions separated from each other by less than 10 microns. Preferably, the separation is one of the preferred dimensions above.

The present invention also provides a device including an article defining a surface, and a self-assembled monolayer on the surface, forming a pattern having a lateral dimension of less than 10 microns. Preferably, the lateral dimension is one of the preferred dimensions above.

The present invention also provides methods utilizing the above and other devices and arrangements, including a method of diffracting electromagnetic radiation. The method involves directing electromagnetic radiation at a liquid metal having a surface that is a diffraction grating to cause diffraction of the electromagnetic radiation, and allowing diffracted electromagnetic radiation to reflect from the surface. The surface of the liquid metal that is a diffraction grating can be deformed (elongated or stretched, bent, compressed, e.g.) to adjust the pattern of diffraction of the electromagnetic radiation.

The present invention also provides a method of focusing electromagnetic radiation, involving directing electromagnetic radiation at a liquid metal having a concave surface, and allowing the electromagnetic radiation to reflect from the surface.

The present invention also provides a method of controlling the shape of a liquid, involving providing a supporting, electrically-conductive surface having, on a discrete isolated region, a self-assembled monolayer of a molecular species exposing a chemical functionality that is compatible with the liquid, positioning the liquid on the self-assembled monolayer of the molecular species, surrounding the liquid with a fluid electrolyte that is not compatible with the liquid, and adjusting an electrical potential of the electrically-conductive surface to control the shape of the liquid.

The present invention also provides a method of printing a self-assembled monolayer on a surface of an article, involving rolling over the surface of the article a nonplanar stamping surface of a stamp carrying a self-assembled monolayer-forming molecular species.

Other advantages, novel features and objects of the invention will become apparent from the following detailed description of the invention when considered in conjunction with the accompanying drawings.

DETAILED DESCRIPTION OF THE INVENTION

Figure 1A:
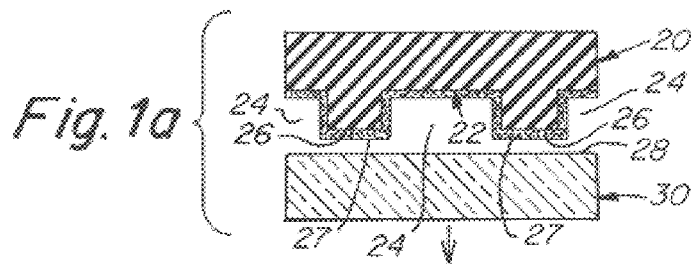
FIGS. 1a–f illustrate microprinting of a self-assembled molecular monolayer on a surface, utilizing controlled reactive spreading in accordance with the invention.

Commonly-owned U.S. patent application Ser. No. 08/131,841, filed Oct. 4, 1993 by Kumar et al. and entitled "Formation of Microstamped Patterns on Surfaces and Derivative Articles", now U.S. Pat. No. 5,512,131, issued Apr. 30, 1996, the entire content of which is incorporated herein by reference for all purposes, describes stamping, or microprinting, self-assembled monolayers onto surfaces, etching and plating such surfaces, assembling isolated regions of self-assembled monolayers exposing a particular chemical functionality, optionally surrounded by a self-assembled monolayer exposing a different functionality, and derivative articles. U.S. application Ser. No. 08/397,635, filed Mar. 1, 1995, co-pending and commonly-owned, is incorporated herein by reference for all purposes.

Referring to FIGS. 1a–d, a method for applying a self-assembled monolayer of a molecular species to a surface that involves controlled, reactive spreading of the species on the surface is illustrated schematically. The method results in two or more self-assembled molecular monolayers, or two or more regions of a single self-assembled molecular monolayer, that are very closely spaced on the surface. At FIG. 1a, a stamp 20 is illustrated having a surface 22 including a plurality of indentations 24 formed therein that form an indentation pattern. The indentations are contiguous with a stamping surface 26 that defines a stamping pattern. The stamping pattern includes closely-spaced features, that is, the indentations are closely-spaced and this results in the presence of closely-spaced protrusions, the outward-facing surfaces of which define the stamping surface 26.

Prior to microprinting, stamping surface 26, typically the entire surface 22 of the stamp, is coated with a molecular species 27. Molecular species 27 terminates in a functional group selected to bind to a particular material, and to form an ordered self-assembled monolayer thereupon. In the embodiment illustrated in FIGS. 1a–f, species 27 terminates in a functional group selected to bind to a surface 28 of an article 30, and to form a self-assembled monolayer on surface 28. A wide variety of species suitable as species 27 and surfaces suitable as surface 28, that is, species that terminate in a variety of functional groups, and surfaces to which they chemisorb, are described in U.S. Pat. No. 5,512,131.

Figure 1B:
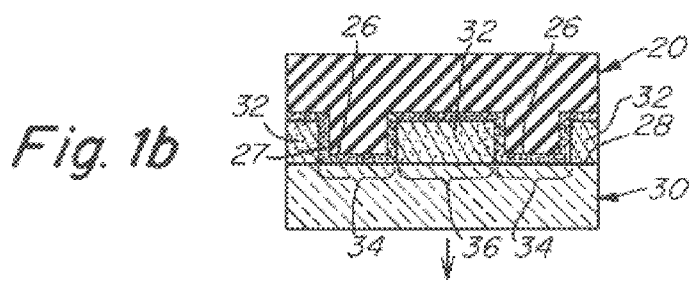
Figure 1C:
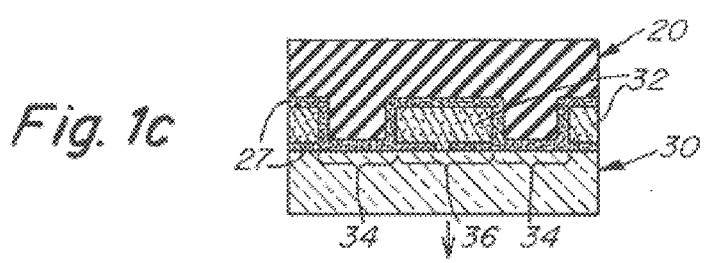

Referring to FIG. 1b, stamp 20 is placed, in a predetermined orientation, adjacent to article 30 such that stamping surface 26 contacts article surface 28. Prior to, during, or shortly after stamping surface 26 is brought into contact with surface 28, a species 32 is applied to portions of surface 28 of article 30 that are not contacted by stamping surface 26. That is, surface 28 of article 30 includes at least a first portion 34 to which the self-assembled molecular species is transferred from the stamping surface, and at least a second portion 36, contiguous with first portion 34, to which is applied species 32.

Species 32 is incompatible with self-assembled monolayer-forming molecular species 27. As used herein, "compatible" is used to define species that have at least some mutual attraction, or at least are not mutually repulsive. For example, two polar species are compatible, and two nonpolar species are compatible. Miscible liquids, for example two different aqueous solutions, are compatible species. "Incompatible" is used herein to define species that are mutually repulsive to the extent that they are not miscible. For example, most organic liquids are incompatible with most aqueous solutions. Incompatible liquids will coexist separated by a phase boundary. An etchant that is inert with respect to a species such as a self-assembled monolayer is often inert with respect to the species since it is incompatible with the species. One of ordinary skill in the art can readily select such incompatible species, and a test to determine the compatibility or incompatibility of such species is routine to one of ordinary skill in the art. Species 32 is selected as one that does not chemisorb to surface 28. Thus, species 32 has a lesser affinity for surface 28 than does self-assembled monolayer-forming molecular species 27.

Typically, species 27 is a hydrophobic liquid or is carried in a hydrophobic liquid, as described in the above-referenced U.S. Pat. No. 5,512,131. Species 27 also can be a hydrophilic liquid, or carried in a hydrophilic liquid. When species 27 (or a liquid in which species 27 is dissolved) is hydrophobic, species 32 is selected to be hydrophilic. When species 27 is hydrophilic, species 32 is selected to be hydrophobic. It is important only that species 27 and species 32 are incompatible.

For example, species 27 can include a hydrophobic long-chain alkyl group that terminates in a functional group that spontaneously chemisorbs to surface 28, and species 32 can be water or an aqueous solution. Alternatively, species 27 can be a long-chain alkyl group including sufficient heteroatoms to make species 27 hydrophilic and species 32 in that case can be a liquid that is sufficiently hydrophobic to be incompatible with species 27.

Referring now to FIG., 1c, The method involves allowing stamping surface 26 to remain in contact with surface 28 for a period of time sufficient to allow molecular species 27 to spread from portion 34 of surface 28 onto portion 36 of the surface. This occurs as species 27, transferred from stamping surface 26, has a greater affinity for surface 28 of article 20 than does species 32.

Stamp 20 is maintained in contact with article 30 for a period of time sufficient to allow species 27 to spread over surface 28 to a desired extent. The extent of spreading is, typically, approximately proportional to the time of contact between stamp 20 and article 30. Stamp 20 is advantageously allowed to contact article 30 for a period of time sufficient to allow species 27 to spread from each portion of stamping surface 26 toward an adjacent portion. In this way, species 27 is allowed to spread across surface 28 to form an increasingly narrow gap 38 (FIG. 1d) on surface 28. Gap 38 on surface 28 thus is not coated with species 27.

The presence of incompatible species 32 applied to portions of surface 28 that are not coated with species 27 facilitates the spreading of species 27 over surface 28 in a smooth, well-defined manner. That is, species 27 does not spontaneously chemisorb at random, isolated portions 36 of surface 28 between adjacent regions of stamping surface 26 via vapor transport or the like. The method of the invention results in very well-defined, very closely-spaced regions of species 27 on surface 28.

Figure 1D:
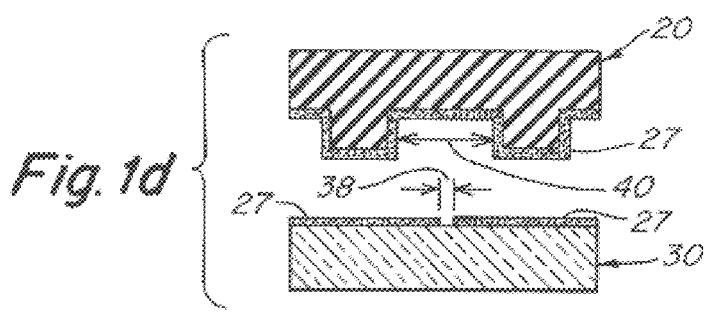
Figure 1E:
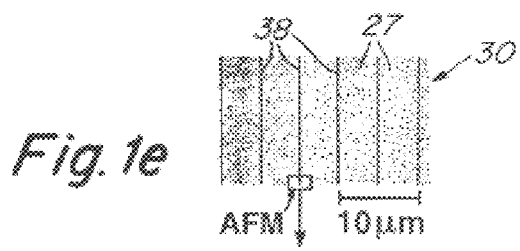

In FIG. 1d, stamp 20 has been removed from article 30, and a scanning electron micrograph of the surface of article 30 that has been patterned according to the embodiment illustrated is shown in FIG. 1e. In the embodiment illustrated, dimension 40, the width of indentations 24 between protrusions of stamp 20 that define stamping surface 26, is 3 microns, while the dimension of gap 38 between adjacent regions of self-assembled monolayer 27 that have spread toward each other is 0.1 micron.

Figure 1F:
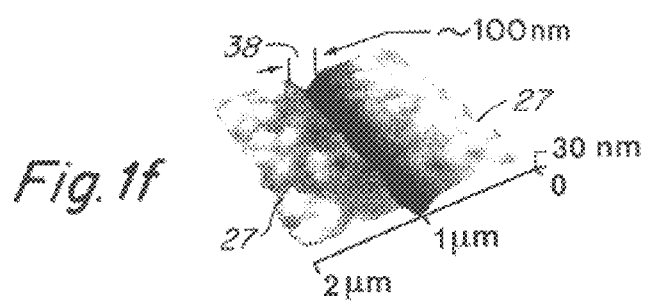
Figure 2A:
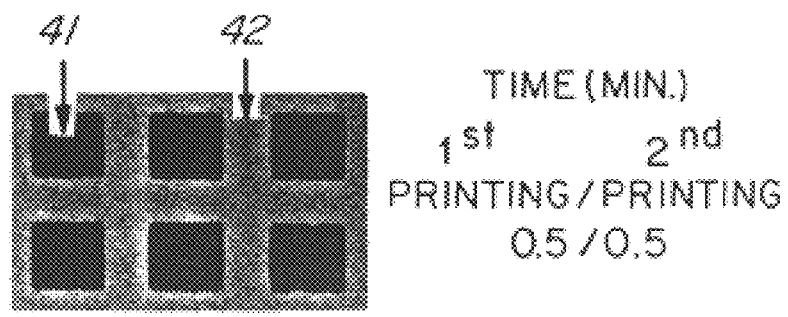
FIGS. 2a–e illustrate silicon surfaces selectively patterned with gold using controlled reactive spreading in conjunction with microprinting in accordance with the invention.
Figure 2B:
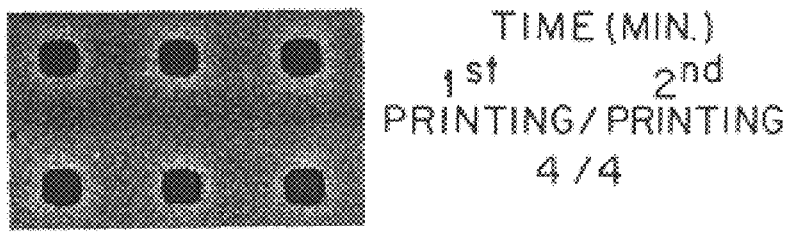
Figure 2C:
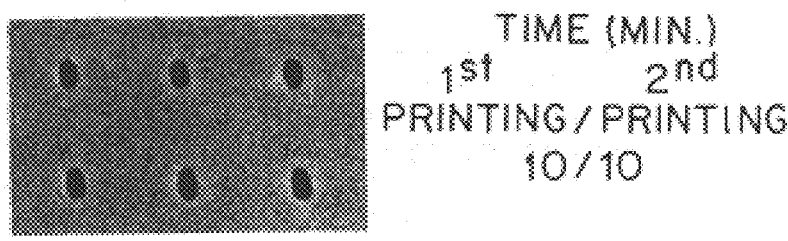
Figure 2D:
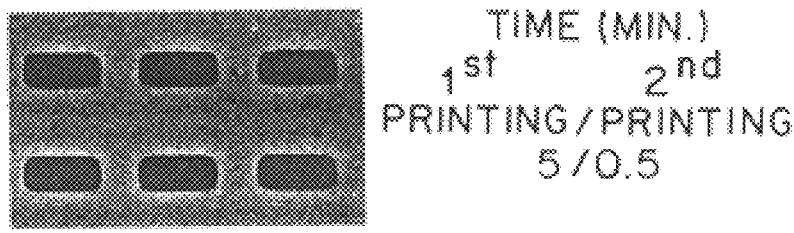
Figure 2E:
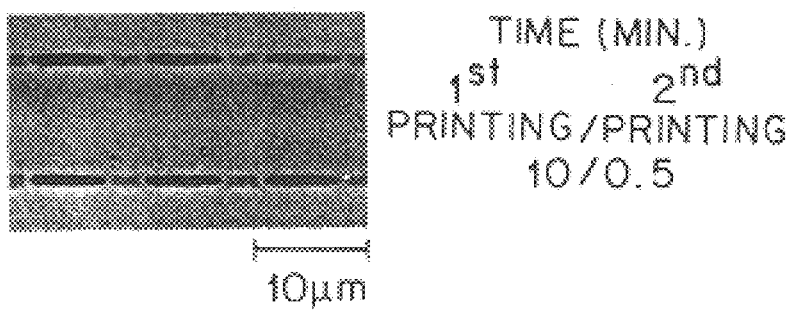

FIG. 1e is a scanning electron micrograph of a silicon article 30, coated with a thin layer of gold, upon the surface of which species 27 has been allowed to spread in accordance with the method illustrated in FIGS. 1a–d. After removal of stamp 20, an etchant is applied to the surface. The etchant is not compatible with species 27, and species 27 is therefore undisturbed by the etchant. The etchant contacts surface 28 of the thin gold layer on silicon article 30 (not shown in FIGS. 1a–d) via gap 38, and dissolves the gold layer at gap 38. The result is illustrated in FIG. 1e, and an atomic force microscope image is shown in FIG. 1f. Following removal of the self-assembled monolayer of species 27, a thin gold layer that has been etched at gap 38, to form adjacent regions of gold on a silicon surface separated by approximately 0.100 micron, results.

FIGS. 1a–d illustrate an end view of a stamp 20 that includes a plurality of elongated, linear ridges 26, separated by recessed portions of the stamp. When such a stamp is brought into contact with a surface of an article in a first orientation, followed by removal of the stamp, rotation of the stamp through 90° relative to the surface of the article, and reapplication of the stamp to the surface, a grid pattern of species 27 on surface 28 results. During each application of the stamping surface to the surface of the article, the stamp can be held in contact with the stamping surface for varying periods of time, resulting in a grid of lines of molecular species 27 of varying width. Scanning electron micrographs of such a procedure are shown in FIGS. 2a–e. The surfaces shown in FIGS. 2a–e were derivatized by covering a silicon article with thin layer of gold, applying species 27 to the gold surface via microprinting with a microstamp, and contacting exposed portions of the gold surface (those portions not covered by the self-assembled monolayer) with an etchant that is not compatible with species 27 and that dissolves gold. The etchant is thus inert with respect to species 27. For each of FIGS. 2a–e, stamp 20 was applied to the surface in a first orientation for a first period of time ("1st printing"), and applied to the surface in a second orientation rotated 90° from the first orientation for a second period of time ("2nd printing"). The time that stamping surface 26 was allowed to contact surface 28, for each printing step, is listed beside each figure. Control of the length and width of exposed portions of silicon results. Dark portions 41 are exposed regions of silicon following etch, and light regions 42 are the self-assembled monolayer on the gold surface. The procedures described with respect to FIGS. 1 and 2 are described in greater detail below in Example 1.

Figure 3A:
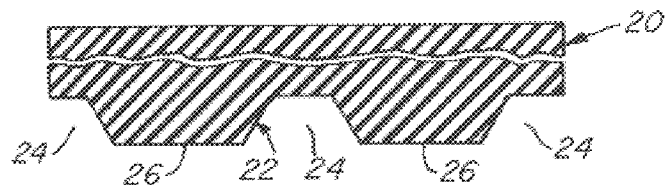
FIGS. 3a–c illustrate deformation of a microprinting stamp to achieve patterned self-assembled molecular monolayers with small features in accordance with the invention.
Figure 3B:
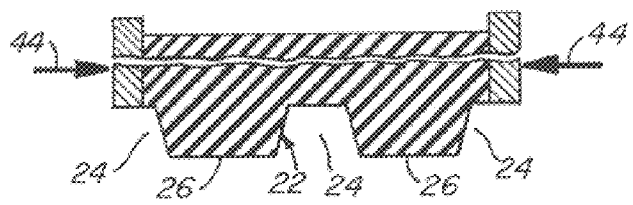
Figure 3C:
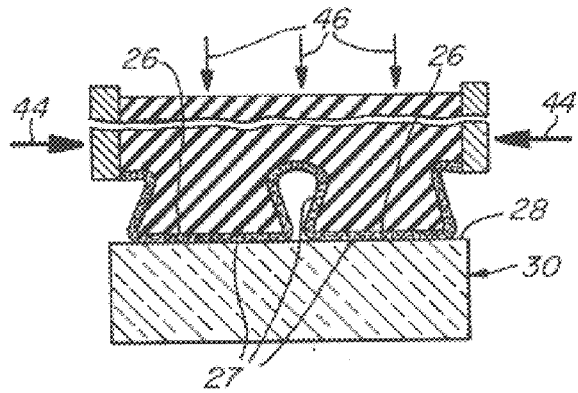

Referring now to FIGS. 3a–c, a method for applying a self-assembled monolayer of a molecular species to a surface of an article according to another embodiment of the invention is illustrated, in which a stamp is deformed prior to and/or during transfer of the species to the surface. FIG. 3a illustrates, schematically, an end view of a portion of a stamp 20 including a surface 22 that includes a stamping surface 26 separated by indentations 24. Stamp 20 is deformed prior to and/or during transfer of a self-assembled monolayer-forming molecular species 27, which coats stamping surface 26 (typically coating the entire surface 22 of stamp 20), to surface 28 of article 30. When stamp 20 is deformed prior to transfer, it generally is compressed by applying to the stamp forces parallel to the stamping surface. That is, with reference to FIG. 3b, force is applied to the stamp in the direction of arrows 44. This results in reduction in the dimension of individual portions of stamping surface 26 along the direction of the application of force, as well as reduction of the dimension of indentations 24 in the same direction. That is, features of stamping surface 26 are reduced in size, and in spacing from each other, in the direction parallel to the application of force.

When stamping surface 26 (generally the entire surface 22) of stamp 20 is coated with molecular species 27 (not illustrated in FIG. 3b) and allowed to contact surface 28 of article 30, a self-assembled monolayer is formed on surface 28 that includes regions having lateral dimensions that correspond approximately to the dimension of features of stamping surface 26. Thus, when stamp 20 is deformed as illustrated in FIG. 3b, self-assembled monolayers, or a self-assembled monolayer having separate regions, is formed on a surface with dimensions smaller than those that would be achieved typically when the stamp is not deformed. Referring to FIG. 3c, stamp 20 is illustrated with stamping surface 26 in contact with surface 28 of article 30, where the stamp has been deformed by applying a force perpendicular to stamping surface 26, that is, perpendicular to surface 28 of article 30. This perpendicular force is represented by arrows 46, and can be applied independently of, or in combination with, a compressive force on the stamp that is parallel to the stamping surface and that is represented by arrows 44. Application of a compressive force represented by arrows 44 and/or a perpendicular force represented by arrow 46 will result in reduced feature sizes of species 27 on surface 28. When a force perpendicular to stamping surface 26 is applied, as represented by arrows 46, gap 38 between regions of species 27 on surface 28 is smaller than the dimension of indentations 24 between regions of stamping surface 26. Thus, the stamp is deformed as illustrated in FIG. 3c where the distance between adjacent regions of stamping surface 26 is lessened.

Although only compressive forces are described with respect to deformation of stamp 20 during microprinting, stamp 20 can be deformed by stretching, as well.

Figure 4A:
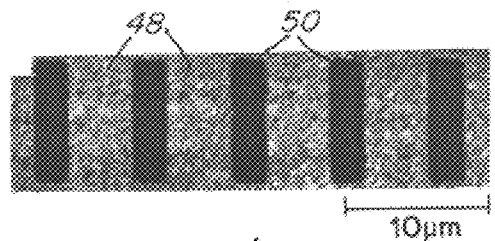
FIGS. 4a–d illustrate silicon surfaces selectively patterned with gold via mechanical deformation of a stamp in accordance with the invention.
Figure 4B:
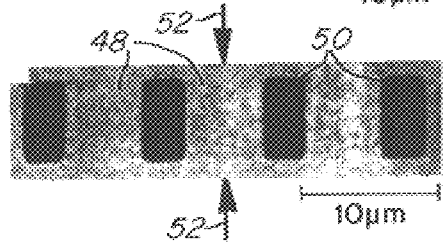
Figure 4C:
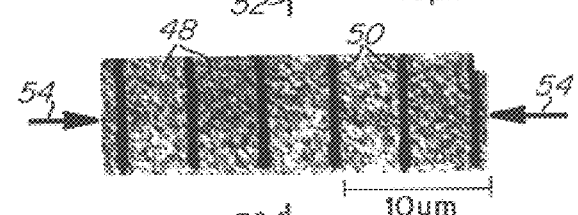
Figure 4D:
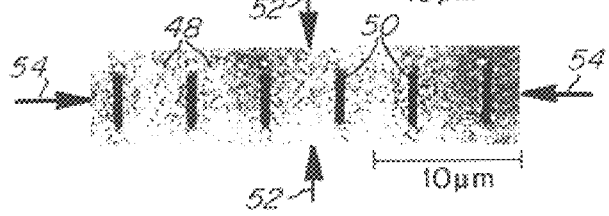

Referring now to FIGS. 4a–c, scanning electron micrographs showing surfaces derivatized via microstamp deformation are shown. The figures represent printing using a microstamp deformed by compressing the stamp by applying force parallel to the stamping surface (arrows 44 of FIG. 3b), independently along perpendicular axes. A silicon article covered with a thin layer of gold was provided, with a self-assembled monolayer applied to the gold surface. Gold was etched from regions to which the monolayer was not applied. In FIGS. 4a–c, light regions 48 represent the self-assembled monolayer on the thin gold film on silicon, and regions 50 represent exposed silicon surface from which gold has been etched. A stamp used to apply a self-assembled monolayer to the gold surface was fabricated generally as described below in example 1, and included a surface including indentations represented by regions 50, defining a stamping surface represented by regions 48. FIG. 4a illustrates a surface to which a self-assembled molecular monolayer was applied from the stamp without deformation of the stamp, followed by etching of gold from regions to which the self-assembled monolayer was not applied. In FIG. 4b, the stamp was compressed along an axis parallel to the stamping surface, by applying force as illustrated by arrows 52. In FIG. 4c, the stamp was compressed along an axis parallel to the stamping surface, by applying force in the direction of arrows 54, perpendicular to the compressive force applied in FIG. 4b. In FIG. 4d, the stamp was compressed along two perpendicular axes, both axes being parallel to the stamping surface, by applying force as illustrated by arrows 52 and 54.

Mechanical deformation of a stamp as described above and illustrated in FIGS. 3a–c and 4a–d can be employed in conjunction with controlled reactive spreading of molecular species as described above and illustrated in FIGS. 1a–f and 2a–e. That is, a stamp can be deformed, and held in contact with a surface to transfer a self-assembled monolayer thereto, while applying, to regions of the surface not contacted by the stamping surface, a species that is not compatible with the molecular species that forms the self-assembled monolayer. This procedure, as described above, advantageously includes allowing the stamp to remain in contact with the surface for a period of time sufficient to allow the molecular species to spread accordingly.

All of the embodiments of the invention described thus far can be used in conjunction with methods of etching and/or plating a surface as described below, and as described in U.S. Pat. No. 5,512,131, referenced above.

Figure 5A:
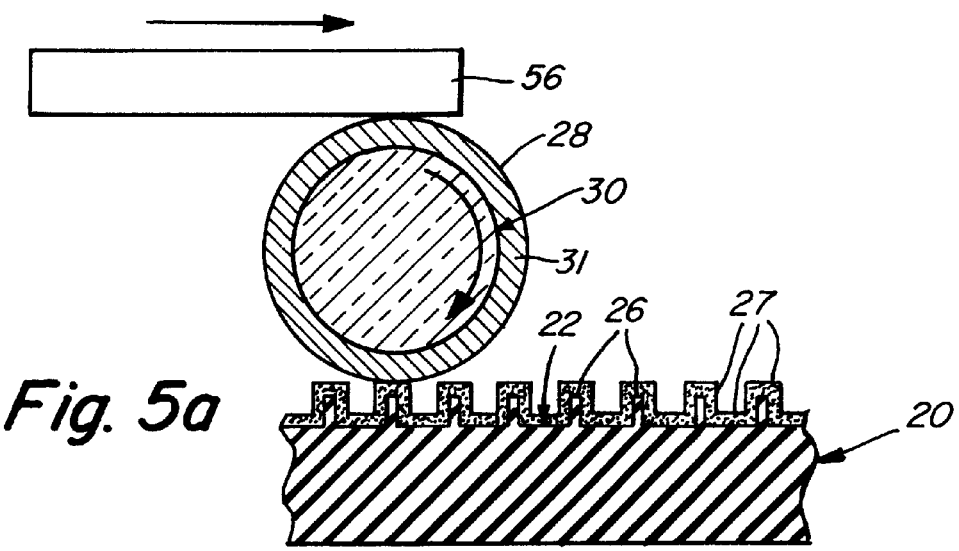
FIGS. 5a–c illustrate a method of applying a patterned self-assembled molecular monolayer to a nonplanar surface in accordance with the invention.
Figure 5B:
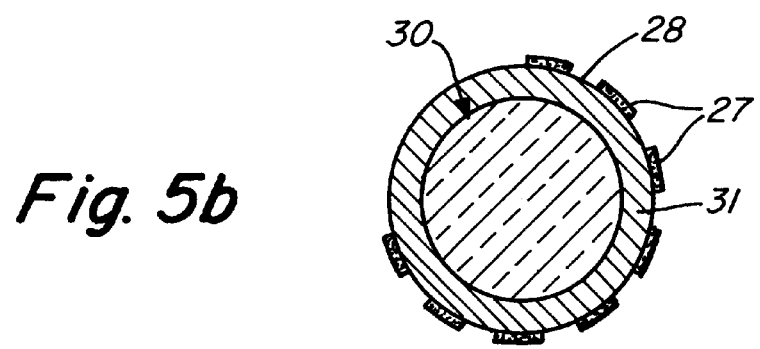
Figure 5C:
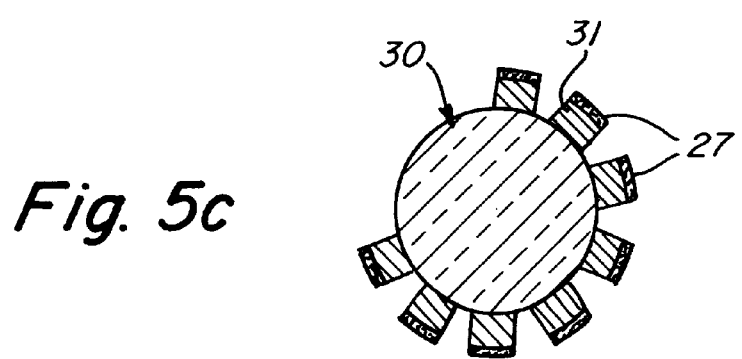

Referring now to FIGS. 5a–c, a method of transferring a patterned, self-assembled monolayer to a nonplanar surface is illustrated schematically. As used herein, the term "nonplanar" is meant to define a surface, at least a portion of which has a radius of curvature. The method that is illustrated involves rolling a nonplanar surface, that is, the surface of a nonplanar article, over a stamping surface of a stamp carrying a self-assembled monolayer-forming molecular species. The surface that is rolled over the stamp can be that of a cylindrical article, a spherical article, or any other article having a nonplanar surface. Stamp 20 in this embodiment is flat, that is, stamping surface 26 defines portions of a plane. In other embodiments (not illustrated), the stamp is nonplanar, that is, formed such that the stamping surface does not define a plane, or is a flexible, planar stamp that is deformed so as to be nonplanar.

Referring to FIG. 5a, an article 30 has a nonplanar surface 28. According to the embodiment illustrated, article 30 is silicon dioxide, coated with a thin layer of titanium (not shown), which is coated with a thin layer of 31 of gold. Stamping surface 26 of stamp 20, and generally the entire surface 22 of stamp 20 is coated with a self-assembled monolayer forming molecular species 27. Article 30 is caused to roll over stamping surface 26, for example, by placing article 30 between stamping surface 26 and a member 56, moving stamp 20 and member 56 relative to each other along parallel planes in opposite directions, to cause the article to roll over the stamping surface. Member 56 can be made of any material that will not disrupt or contaminate surface 28, and preferably a material that will not disrupt a self-assembled monolayer formed on surface 28. Member 56 can be made of the same material from which stamp 20 is made.

As used herein, the term "roll" refers to action in which a first surface is maintained in constant contact with a second surface (for example, surface 28 of article 30 and stamping surface 26, respectively), but only a portion of each surface is in contact with only a portion of the other surface at any given time, and the portion of each surface that is in contact with the portion of the other surface changes continuously.

Referring now to FIG. 5b, article 30 is illustrated after having been rotated through approximately 260° of rotation on stamping surface 26. As a result, individual, isolated regions of a self-assembled monolayer of molecular species 27 are formed on surface 28 of article 30 around approximately 260° of the surface, corresponding to individual regions of stamping surface 26.

When this article is subject to a cyanide etch, as described above and described below in Example 2, gold that is not protected by molecular species 27 is removed, as illustrated in FIG. 5c, exposing the thin layer of titanium (titanium dioxide) at regions not covered by the self-assembled monolayer. A nonplanar article, such as that illustrated in FIGS. 5a–c, can be etched in accordance with embodiments of the invention described in U.S. Pat. No. 5,512,131, and described below.

Figure 6A:
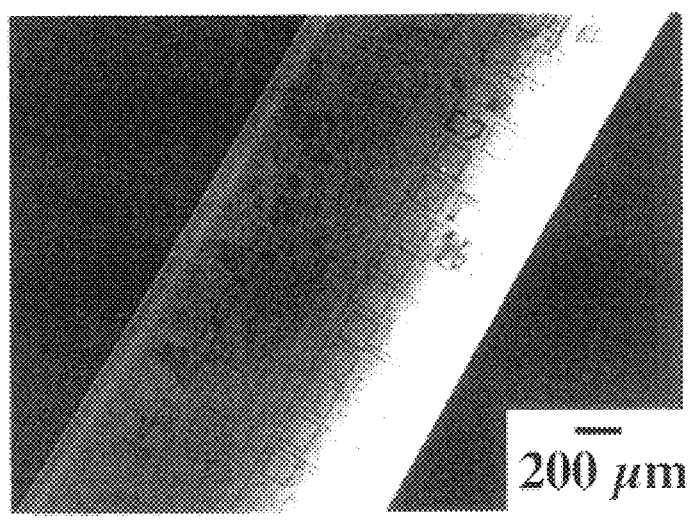
FIGS. 6a–c illustrate nonplanar surfaces derivatized using the technique illustrated in FIGS. 5a–c.
Figure 6B:
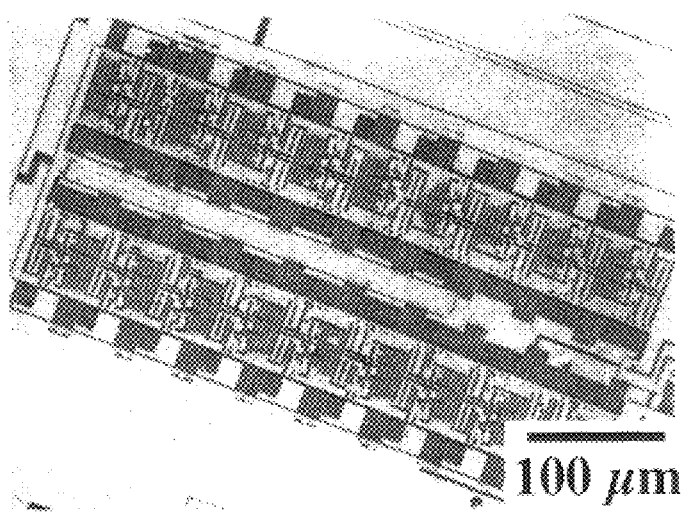
Figure 6C:
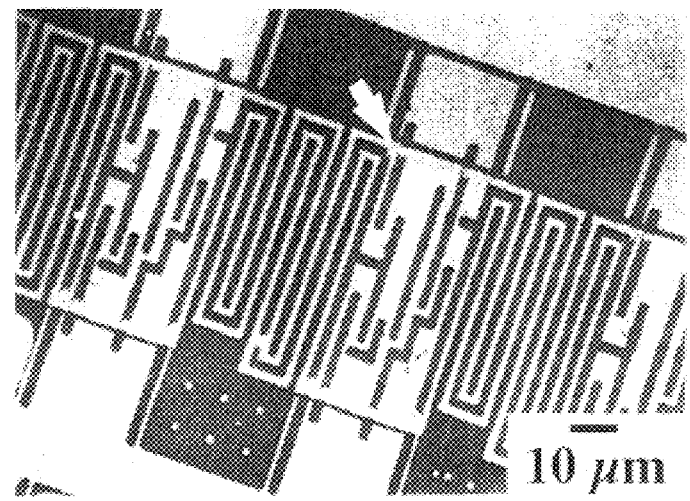

Referring now to FIGS. 6a–c, nonplanar articles covered by a thin layer of gold, to which patterned, self-assembled monolayers have been applied, followed by etching of gold from the surface at regions not protected by the self-assembled monolayer, are illustrated. In each case, the nonplanar article was rolled across a substantially planar stamping surface including a stamping pattern (pattern formed by stamping surface 26). The stamping pattern includes features similar to those found in typical electronic circuitry. Gold was etched as described above and described below in Example 2.

FIG. 6a illustrates a 1 mm diameter glass capillary coated with a thin layer of gold, which was printed according to the pattern illustrated, followed by removal of gold from the areas not covered by a self-assembled monolayer. FIGS. 6b and 6c show views, at different magnification, of a lens having a 5 cm radius of curvature, coated with a thin film of gold, microprinted and etched as described herein. In FIGS. 6a–c, light regions are gold covered with a self-assembled monolayer, and dark regions are glass.

Figure 7:
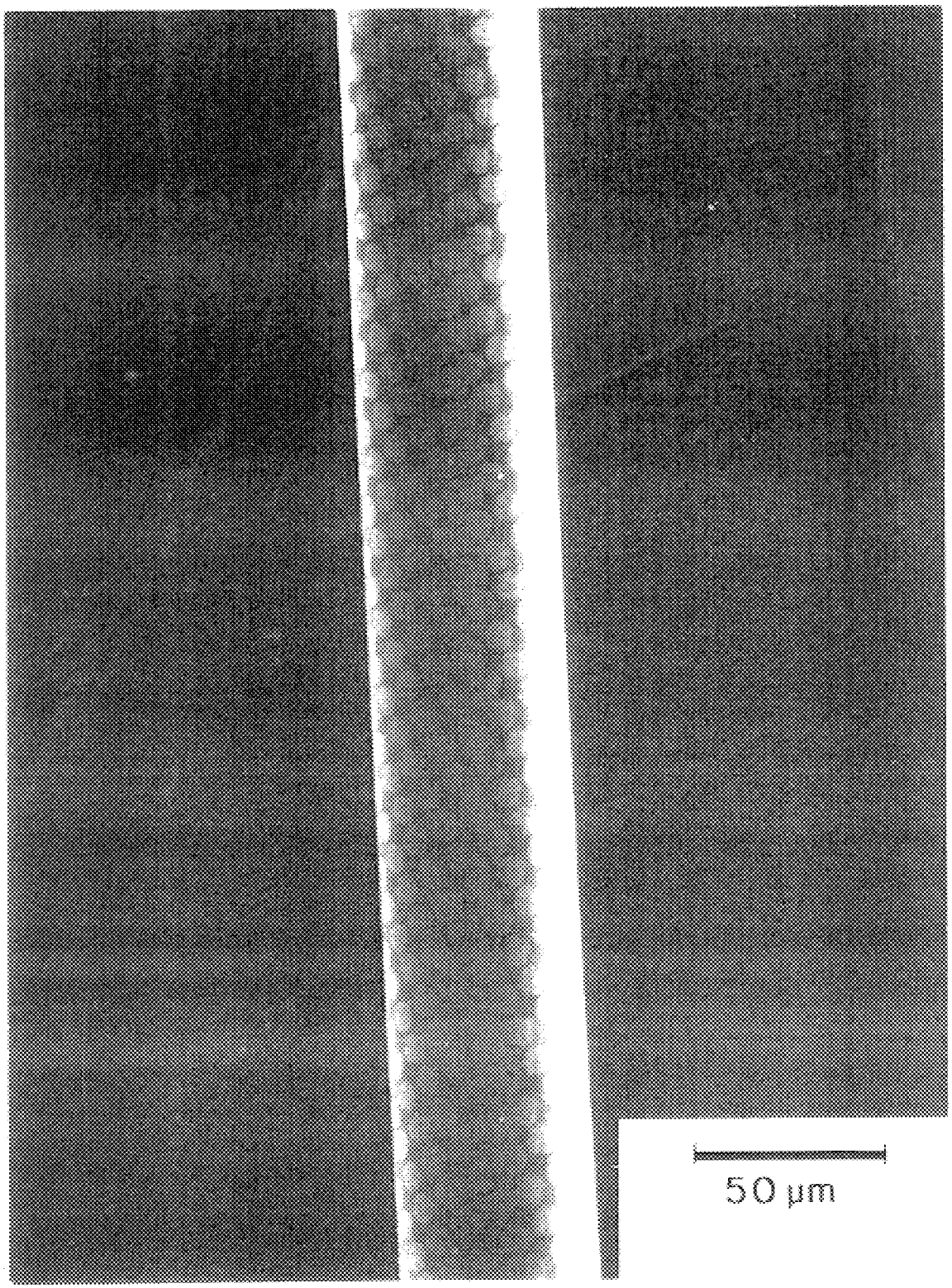
FIG. 7 illustrates an optical fiber having an exterior surface patterned with a self-assembled molecular monolayer according to the invention.

FIG. 7 illustrates an etched optical fiber (glass). The fiber was coated with approximately 200 angstroms of titanium, which is coated with approximately 200–300 angstroms of gold. The exterior surface of the fiber was microstamped with hexadecanethiol, which served as a resist in a subsequent etch. The etch step removed the gold layer not covered by the self-assembled monolayer, and the light regions represent a self-assembled monolayer of hexadecanethiol on gold, while the dark regions represent the exterior surface of the optical fiber covered with titanium.

In some instances, when it is desirable to use a self-assembled monolayer as a resist in an etching process, the self-assembled monolayer may not effectively resist the etchant. The present invention provides, for such a situation, a protecting species positioned on a self-assembled monolayer. The protecting species is inert with respect to the etchant by, for example, being incompatible with the etchant. The protecting species is compatible with the exposed functionality of the monolayer. For example, silicon coated with a thin, thermally-formed layer of silicon dioxide, is conveniently etched using hydrofluoric acid/ammonium fluoride. Then, silicon dioxide that has not been etched can serve as a resist for the etching of silicon and, for example, potassium hydroxide/isopropanol. However, many self-assembled molecular monolayers will not withstand (are not inert with respect to) the etchant used to remove silicon dioxide. The present invention provides a protecting species that will resist the etch. Many articles have a native layer of oxide. For example, silicon has a native layer of oxide that is approximately 5 nanometers thick. Generally, such a native layer will not serve as an effected resist. A thermally-formed oxide layer will generally have a thickness of approximately 0.2 microns. Articles having thermally formed layers of oxide thereon are readily available commercially. For example, silicon including a thermally-formed layer of silicon dioxide thereon is available from Silicon Sense Corporation, Nashua, New Hampshire.

Referring to FIGS. 8a–d, a process for etching silicon in accordance with the present invention is illustrated. FIGS. 8a–d are schematic illustrations of the process.

Figure 8A:
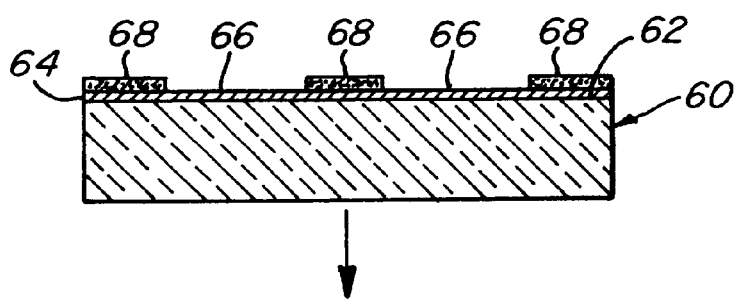
FIGS. 8a–d illustrate a method of etching an article according to the invention.
Figure 8B:
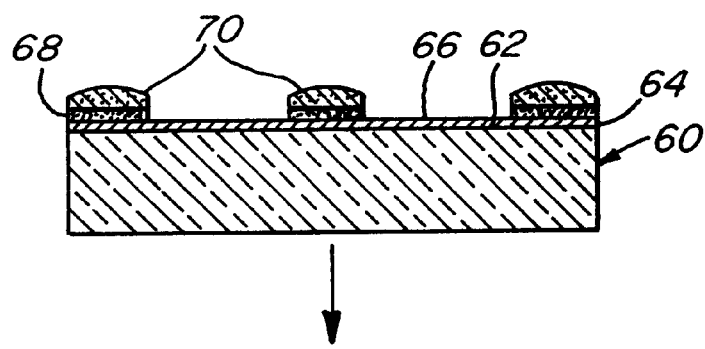
Figure 8C:
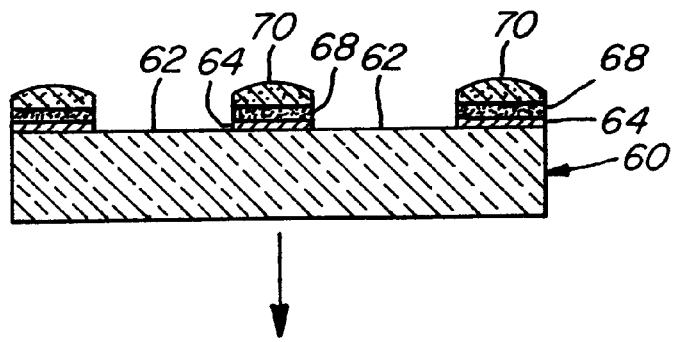
Figure 8D:
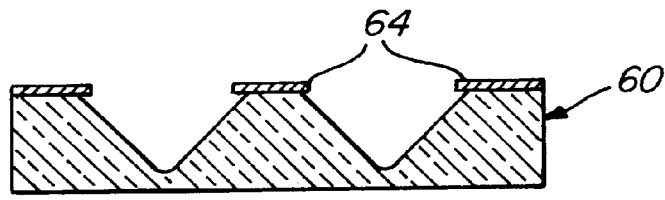

Referring to FIG. 8a, a silicon article 60 includes, on its surface 62, a thermally-formed layer 64 of silicon dioxide, having a surface 66. A self-assembled monolayer 68 (for example alkylsiloxane) is patterned onto the surface 66, using any method described herein or other method known to those of skill in the art. Referring to FIG. 8b, molecular species 68 is coated with a protecting species 70 that is compatible with the molecular species. That is, molecular species 68 exposes a chemical functionality that is compatible with the protecting species. If the chemical functionality exposed by molecular species 68 is significantly polar, protecting species 70 should be significantly polar. Protecting species 70 can be a liquid, and can be a polymerizable species that is polymerized prior to application of the etchant.

Referring to FIG. 8b, following application of protecting species 70 to molecular species 68, a first etchant (for example HF/NH$_4$F, not shown) is brought into contact with exposed portions of surface 66, whereupon the portions of silicon dioxide resist layer 64 that are not covered by self-assembled monolayer 68 and protecting species 70 are dissolved, exposing corresponding portions of surface 62 of silicon. Subsequently, a silicon etch (for example, KOH/I-PrOH) is added, and the silicon dioxide that had been covered by the self-assembled monolayer and protecting species 70 acts as a resist for a silicon etch.

Referring to FIGS. 8*a–d*, according to one embodiment an etchant is used that is destructive of a self-assembled monolayer, and in this embodiment a protecting species is advantageously used. According to another embodiment, a resist is used that can be etched with an etchant that does not destroy a self-assembled monolayer, and in this embodiment the protecting species need not be used. An example of the latter embodiment involves etching a silicon article coated with a thin film of gold. The gold in that embodiment defines a resist having a surface, to which can be transferred a self-assembled monolayer in a pattern, the self-assembled monolayer being contiguous with exposed portions of the gold surface in a second pattern. The surface of the article (the surface of silicon) can be exposed by removing gold from the surface (according to the second pattern) by contacting the exposed portions of gold with an species that reacts chemically with gold and that is inert with respect to the self-assembled monolayer. This exposes the surface of the article, according to the second pattern. Then, the exposed surface of the article can be etched, if the etchant is inert with respect to the resist (gold).

In an alternative method, a self-assembled monolayer can be applied to the surface according to a first pattern, exposing a first functionality. The remaining portions of the surface are filled in with a self-assembled monolayer of a second species exposing a second chemical functionality. A protecting species that is compatible with the second chemical functionality is applied to the surface, and adheres to the self-assembled monolayer of the second species, protecting a pattern on the surface that is complementary to the first pattern, that is, protecting regions of the surface that do not include the first pattern.

A variety of materials can be deposited on the surface of the article to serve as a resist. For example, thin layers of metal such as gold, silver, copper, nickel, cadmium zinc, palladium, platinum, iron, chromium, alloys of these and the like can be deposited by those of skill in the art. Etchants that will dissolve resist such as these should be selected to oxidize atoms from the surface, and to include ligands, such as chelating or coordinating ligands, that will dissolve the oxidized atoms removed from the surface. Etchants or such resists are known to those in the art, and include aqueous etches such as ferricyanide etch, thiosulfate etch, thiourea etch, and the like. Often an adhesive layer is advantageously placed upon the surface of the article prior to application of the resist layer. The adhesive layer generally will be at least ten angstroms thick, and may be much thicker. The thickness of the resist layer, if it is a metal such as gold, is generally approximately 1000 angstroms. However, the resist can be from about 50 angstroms to many thousands of angstroms, depending upon the application.

Many etchants will not attack a self-assembled monolayer on a surface, thus the self-assembled monolayer can be printed on such a surface, the resist can be etched from regions where the self-assembled monolayer does not lie, and the article can be etched at regions where the resist has been removed. Some etchants, however, that are particularly reactive, for example, aqua regia, carbon tetrafluoride, potassium iodide-iodine and the like, may harm self-assembled monolayers in some circumstances. Etchants that are particularly destructive of self-assembled monolayers are useful, in some circumstances, to etch certain resists from the surface of articles. For example, etching silicon dioxide from the surface of silicon requires etchants that generally at least partially destroy self-assembled monolayers.

According to one embodiment, protecting species 70 is applied to self-assembled monolayer 68 in the following manner. A bath of a fluid that is incompatible with the exposed functionality of self-assembled monolayer 68 is prepared, including a layer of fluid protecting species (or protecting species precursor) over the incompatible fluid. The article illustrated in FIG. 8*a* is passed through the region of the protecting species, which adheres to self-assembled monolayer 68, and passed into the fluid that is incompatible with the self-assembled monolayer. Where the protecting species is a fluid that is hardened, for example via polymerization, polymerization may take place in the bath, or the article may be removed from the bath prior to polymerization.

Figure 9A:
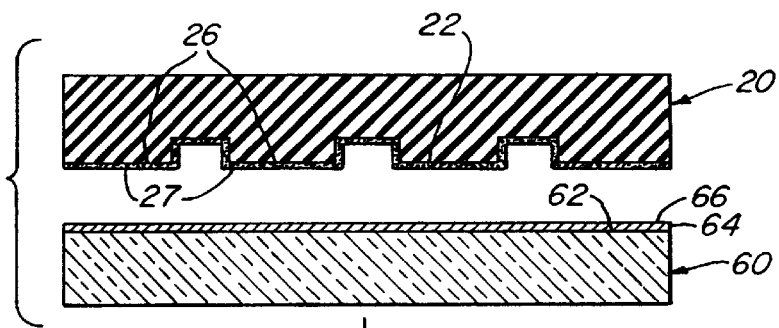
FIGS. 9a–f illustrate a method involving lithographic molding of an article in accordance with the invention.
Figure 9B:
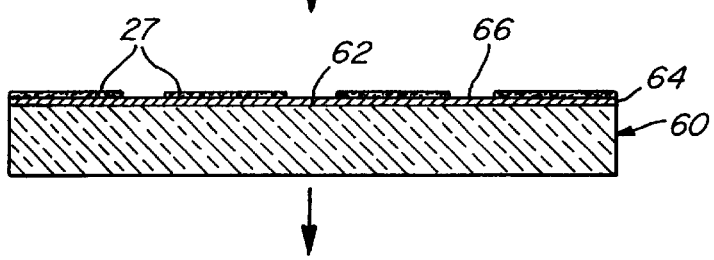
Figure 9C:
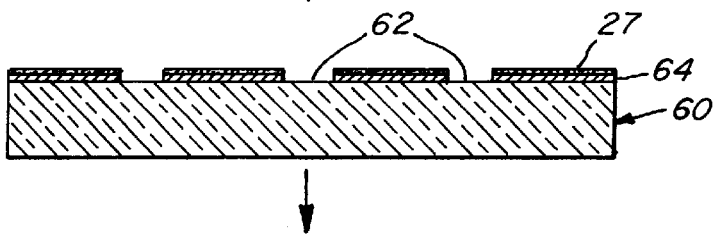
Figure 9D:
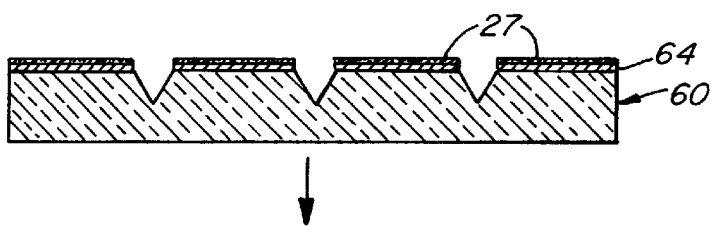
Figure 9E:
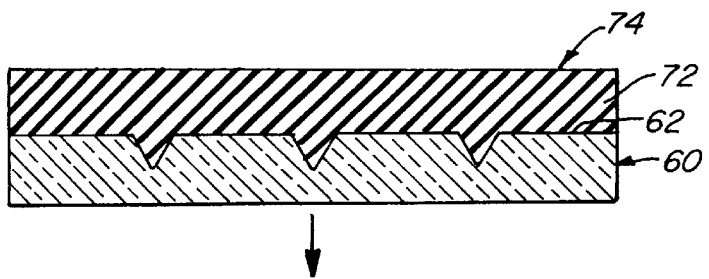
Figure 9F:
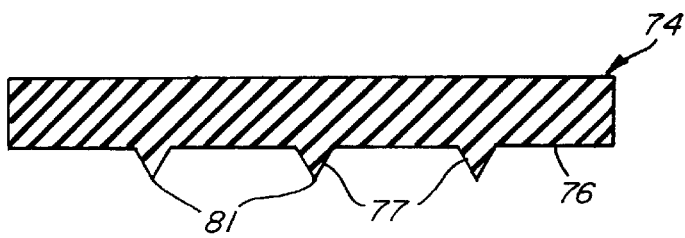

The invention also provides a method for making an article, which utilizes any of the above-described, or known, methods for etching a surface. The etched surface serves as a template for the article according to this method of the invention. The method involves etching a pattern into a surface of a template and molding an article on the surface of the template. An article, formed by molding on the surface of a template, results. An example of such a process is illustrated schematically in FIGS. 9*a–f*. FIG. 9*a* illustrates a silicon article 60 including a surface 62 coated with a layer of resist 64 having a surface 66. In the embodiment illustrated, the resist is a thin layer of gold over titanium (100/1000 angstroms). A self-assembled monolayer-forming molecular species 27 is applied to surface 22 (in particular, stamping surface 26) of a stamp 20. Referring to FIG. 9*b*, a self-assembled monolayer of molecular species 27 is thereby transferred to surface 66 of resist 64 in a pattern corresponding to the pattern of stamping surface 26 of stamp 20. Self-assembled monolayer 27 can be applied to surface 66 according to methods described above and illustrated with reference to FIGS. 1*a*–5*c*. An etchant that is chemically reactive with a resist and that is inert with respect to the self-assembled monolayer is brought into contact with exposed portions of the resist surface (portions not covered by self-assembled monolayer 27). The resist is etched, exposing portions of surface 62 of article 60 (FIG. 9*c*). Subsequently, article 60 is etched by applying to the exposed portions of surface 62 a second etchant that reacts chemically with article 60 and that is inert with respect to resist 64. The result, as illustrated in FIG. 9*d*, is a pattern etched into article 60, which pattern corresponds approximately to a pattern of gaps between closely-spaced regions of self-assembled monolayer 27 (FIG. 9*a*). Removal of resist 64 and self-assembled monolayer of molecular species 27 (if it has not yet been removed) results in a patterned article 60 that is useful for many purposes. One useful purpose, in accordance with the invention, involves using the etched surface of article 60 as a template for fabrication of an article. In FIG. 9*e*, an article has been molded onto surface 62 of article 60. In particular, a hardenable fluid 72, such as a prepolymeric solution, is applied to surface 62 of article 60 and hardened (polymerized, for example), to form article 74. Article 74 then is removed from surface 62 of article 60, and as illustrated in FIG. 9*f* includes a surface 76 that corresponds to surface 62 of article 60. Article 74 can be a stamp used for microprinting, as described above. Alternatively, article 74 can be used as an optical element as described below and as described in U.S. application Ser. No. 08/131,841, referenced above.

An advantage to forming article 74 from a substrate etched lithographically as illustrated in FIGS. 9a–f, from a self-assembled monolayer applied by a microstamp, is that the surface of template 60, if it is an oriented crystal, can be etched to form grooves or pits that form an approximate ridge or point at their deepest portions. The method preferably uses a template that can be etched anisotropically. Generally, any material that forms an oriented crystal can be etched anisotropically using etchants available to those of skill in the art. Such a material can be etched such that a feature etched into its surface has a dimension much smaller than the dimension of the region at the surface of the material to which etchant is applied. For example, silicon is etched anisotropically resulting in grooves that become narrower with depth. An article molded on such a template will include protrusions that decrease in size in a direction away from the center of the article.

As discussed, according to one embodiment a thin film of a resist, such as gold, coats the surface of the article that is etched. According to another embodiment, the article includes an oxide layer on its surface that can serve as a resist. For example, silicon, titanium, zirconium, germanium, aluminum, copper, and other articles known to those of skill in the art would include a surface layer of oxide that can serve as a resist, or a layer of oxide that can serve as a resist can be grown at the surface by, for example, heating the article in the presence of oxygen. Other articles that can be used in accordance with the invention and that can be coated conveniently with a thin layer of resist are semiconductors including gallium arsenide, indium phosphide, cesium chloride, diamond and the like. These and other materials known to those of skill in the art form oriented crystals that can be etched anisotropically. The articles discussed above including layers of oxide can define articles including resist layers, as described above with reference to FIGS. 8a–d.

Figure 10:
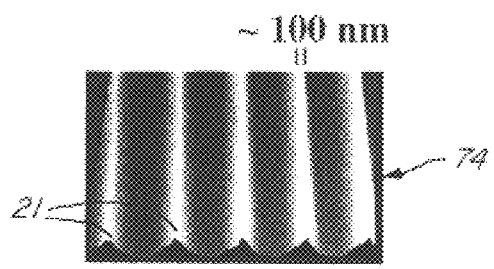
FIG. 10 is an atomic force microscope image of an article lithographically molded in accordance with the invention.

FIG. 10 is an atomic force microscope image of a polydimethyl siloxane (PDMS) article 74 formed according to the method illustrated with reference to FIGS. 9a–f. According to embodiments in which the article is a microstamp, stamping surface 81 include features having a lateral dimension of approximately 0.100 micron or less. Similar articles can be fabricated including, rather than linear ridges defining stamping surface 81 as illustrated in FIG. 10, small, isolated projections that define stamping surface 81, which projections approximate a point. The projections can be in, for example, an ordered array.

According to another embodiment of the invention a method is provided for simultaneously writing, on a surface of an article, at least two self-assembled monolayer patterns. The method involves coating a stamping surface of a microstamp with a self-assembled monolayer-forming species, contacting an article surface with the stamping surface, and moving the stamping surface relative to the article surface to write on the surface. For example, a stamp that includes a plurality of protrusions that, at their terminus (stamping surface), approximate points can be used to write, simultaneously, a plurality of lines on an article surface. Such lines can define a pattern that forms the basis of a corresponding electronic circuit, an etched region, or other feature as described in accordance with the invention or apparent to those of ordinary skill in the art. A stamp with such features can be obtained conveniently by patterning a surface of an article that can be anisotropically etched with resist, forming on the surface of the resist a self-assembled monolayer in a grid pattern while leaving isolated regions of the surface of the resist free of self assembled monolayer, etching the resist that is not covered by the self-assembled monolayer, and etching the surface of the article anisotropically to form a plurality of indentations that become narrower with depth until they approximate a plurality of points. This serves as a template for a stamp that includes a plurality of protrusions that terminate in approximate points at their stamping surface (or writing surface).

As used herein, the term "writing" is given its ordinary meaning. In the context of a self-assembled monolayer, this means forming a pattern of a self-assembled monolayer on a surface not instantaneously, but progressively, in a manner analogous to the way ink is applied to paper when writing with a pen. In this way, a method is provided that involves writing on a surface of an article simultaneously at least two separate lines of a self-assembled monolayer-forming species.

According to embodiments of the present invention in which a self-assembled monolayer is formed on silicon dioxide or glass, advantage can be achieved in aspects of the invention that involve etching, and aspects that involve preparation of surfaces of interest in biological arenas. In aspects that involve etching, when silicon dioxide is used as a resist layer on silicon, advantage in the etching of silicon is achieved as discussed above. Additionally, bulk silicon dioxide or glass can be etched by patterning a self-assembled monolayer of alkylsiloxane, such as octadecylsiloxane, on a surface thereof, optionally coating the self-assembled monolayer with a protecting species, and contacting the surface with an etchant that etches the silicon dioxide or glass.

According to aspects of the invention involving the preparation of surfaces of biological interest, a surface such as a silicon dioxide or glass slide or petri dish can be patterned with a self-assembled monolayer of alkylsiloxane that exposes a chemical functionality of biological interest, facilitating studies at that surface. For example, a self-assembled monolayer of alkylsiloxane terminating in a cytophilic functionality can be patterned onto a silicon dioxide or glass surface in accordance with the invention, followed by adherence or immobilization of a cell or cells to the cytophilic functionality. Biological, specifically cytophilic, functionalities in association with self-assembled monolayers are described in copending, commonly-owned application Ser. No. 08/131,841 and in an article entitled "Engineering Cell Shape and Function", by Singhvi, R., et al. *Science,* 264, 696 (1994), both incorporated herein by reference. This article describes the formation of islands of self-assembled monolayer terminating in a non-polar functionality ($—CH_3$) surrounded by regions of polyethylene glycol-terminating self-assembled monolayer. The nonpolar terminal functionality of the islands is protein adherent, while the polyethylene glycol functionality is not protein-adherent. Exposure of a surface derivatized as such to a protein matrix such as the purified extracellular matrix protein laminin results in cytophilic, protein-coated islands surrounded by cytophobic regions. Exposure of this surface to cells results in cell attachment preferentially to the adhesive (cytophilic), laminin-coated islands and the cells are prevented from extending onto surrounding non-adhesive (cytophobic) regions. Alternatively, a surface derivatized as described above with a patterned, self-assembled monolayer terminating in non-polar, such as methyl, functionality can be contacted with a cell or cells without first treating the surface with a protein matrix such as laminin. According to some embodiments, the cell or cells will secrete a protein matrix such as laminin that will coat the exposed non-polar functionality, and the cell or cells then will adhere thereto.

A variety of cell studies can thereby be conducted that involve immobilization of a cell or cells on one or more islands. Procedures involving cell growth, differentiation, culturing, and the like can be tailored by varying the size and/or shape of islands, spacing between islands, and the like. Those of ordinary skill in the art will appreciate that alkylsiloxane-based self-assembled monolayers on glass or silicon dioxide can be prepared that terminate in a variety of chemical or biochemical functionalities amenable to attachment of biological species such as antibodies, antigens, haptens, proteins, sugar and other carbohydrates, etc., prepared in accordance with methods of patterning described herein. Functionalities such as chelates, etc. as described in commonly-owned, copending U.S. Pat. No. 5,620,850 (Bamdad, et al.), incorporated herein by reference, can be provided at the exposed end of molecules making up self-assembled monolayers patterned on glass or silicon dioxide as well.

According to some embodiments of the invention the above-described techniques involving patterning glass or silicon dioxide can be applied to other polar surfaces including polar polymeric surfaces such as oxidized polyethylene or polystyrene. According to these embodiments alkylsiloxane can be patterned onto a polymeric surface oxidized for example via plasma etch to expose polar functionalities such as hydroxyl, carboxylic acid, aldehyde, or the like. These surfaces can form the basis for all embodiments of the invention described herein, including the biological aspects described above.

Patterning of alkylsiloxane onto glass, silicon dioxide, or polar polymeric surfaces can be carried out according to chemistry known to those of skill in the art. For example, trichlorosilane or trialkoxysilane such as triethoxysilane, when applied to these surfaces in essentially any solvent in which they can be carried (such as water, hexane, toluene, and the like) will form alkylsiloxane on that surface.

The techniques described above involving patterning of alkylsiloxane on glass, silicon dioxide, or polar polymeric surfaces can be carried out on planar or non-planar surfaces, as described herein, and can be combined with techniques described herein involving allowing alkylsiloxane or its precursor to spread onto the surface while contacting the surface simultaneously with a species that is not compatible with the alkylsiloxane or precursor, and involving deforming a stamp from which the alkylsiloxane or precursor is transferred, or both.

Figure 11A:
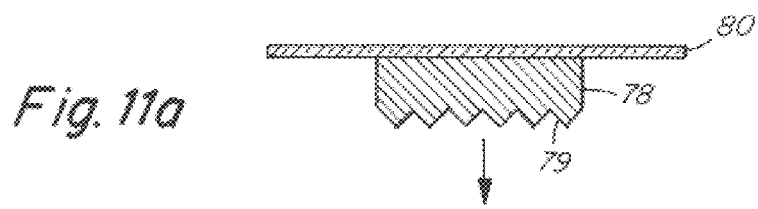
FIGS. 11a–f illustrate methods of forming flexible diffraction gratings in accordance with the invention, and a diffraction grating formed thereby.
Figure 11B:
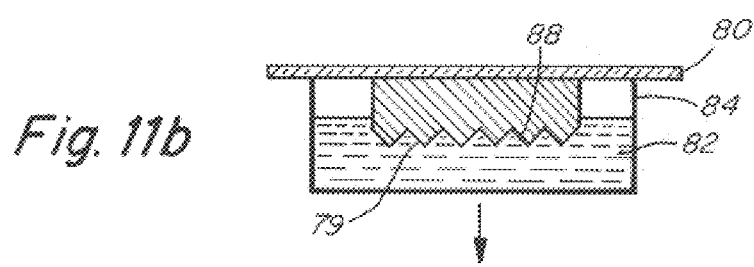
Figure 11C:

The present invention also provides a variety of optical elements and devices. One such element is a diffraction grating that can be formed as described above with respect to article 74 (FIG. 9*f*) or as described in U.S. Pat. No. 5,512,131, referenced above, in which a variety of optical elements including an optical switch are described. According to a preferred embodiment of the invention, a reflective liquid, such as a liquid metal, is brought into contact with a surface that correlates to a surface of an optical element, and a surface of the liquid metal is thereby formed into an optical surface. A method for making such an article is illustrated schematically in FIGS. 11*a–f*. In FIG. 11*a*, a template 78, for example a commercial diffraction grating, is provided. Template 78 can be mounted on a support 80, for example a glass slide. At FIG. 11*b*, a fluid precursor 82 is brought into contact with optical surface 79 of template 78. In the embodiment illustrated, fluid precursor 82 is a prepolymeric solution of polydimethylsiloxane, and is contained in a container 84, for example a petri dish. Fluid precursor 82 is allowed to harden in contact with the optical surface 79. Where precursor 82 is a prepolymer fluid, it is polymerized. When hardened, an article 86 that results from hardening of the fluid precursor is removed from template 78 (FIG. 11*c*), and can be removed from container 84 (FIG. 11*d*; alternatively, article 86 can remain in container 84 during application of a liquid metal to surface 88, and optional encapsulation, discussed below with reference to FIGS. 11*e* and *f*). The resultant article 86 (FIG. 11*d*) has an optical surface 88 that corresponds to optical surface 79 of the template. Article 86 is preferably transparent, and is a transparent elastomeric diffraction grating according to a preferred embodiment.

Figure 11E:
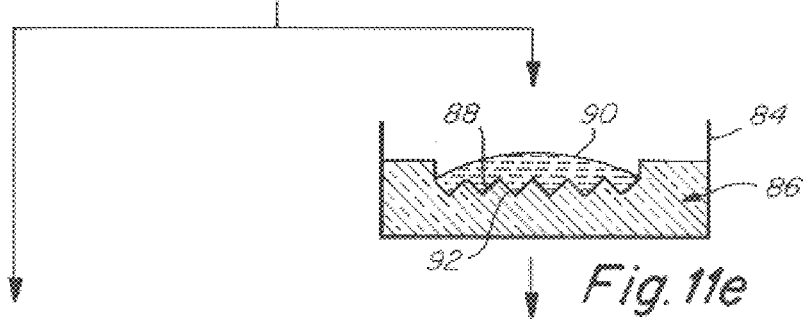
Figure 11D:
Figure 11F:
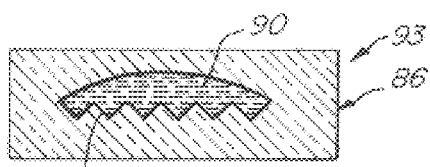

According to a preferred embodiment, optical surface 88 of article 86 is contacted with a liquid metal 90, for example gallium, mercury, or other liquid known to those of skill in the art (FIG. 11*e*). Liquid metal 90 includes a surface 92 that is in contact with and correlates to surface 88 of article 86, and surface 92 of liquid metal 90 is thereby formed into a diffraction grating. If article 86 is transparent, electromagnetic radiation can be directed through article 86 at surface 92, and diffracted (FIG. 11*e*). After liquid metal 90 is brought into contact with article 86 so that a surface 92 of liquid 90 contacts and correlates with surface 88 of article 86, liquid metal 90 can be encapsulated by coating exposed surfaces of the liquid metal with a hardenable fluid, preferably the same fluid as fluid precursor 82, and the fluid allowed to harden. The result, as illustrated in FIG. 11*f*, is an optical element 93 that is a liquid metal having a surface 92 that is an optical surface, which liquid metal is encapsulated in a transparent article 86.

According to an embodiment in which article 86 is flexible, optical surface 92 of liquid metal 90 can be deformed. For example, surface 92 can be compressed, elongated or bent. Where article 86 is an elastomer, surface 92 can be repeatedly elongated and bent. Thus, where the electromagnetic radiation is directed at surface 92 and diffracted, the pattern of diffraction can be adjusted, that is, changed, by manipulating optical element 93, for example by stretching it.

Figure 12A:
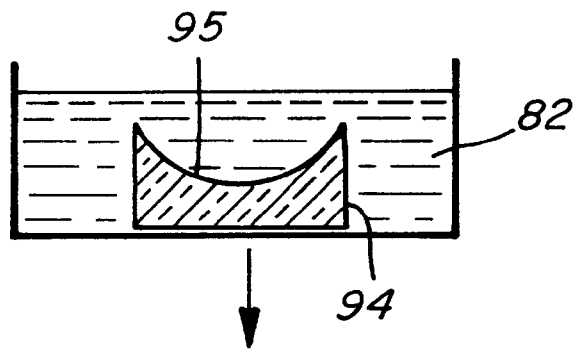
FIGS. 12a–d illustrate a method of forming a flexible lens in accordance with the invention, and a lens formed thereby.
Figure 12B:
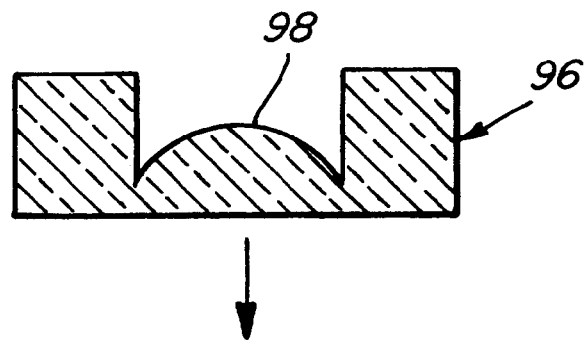
Figure 12C:
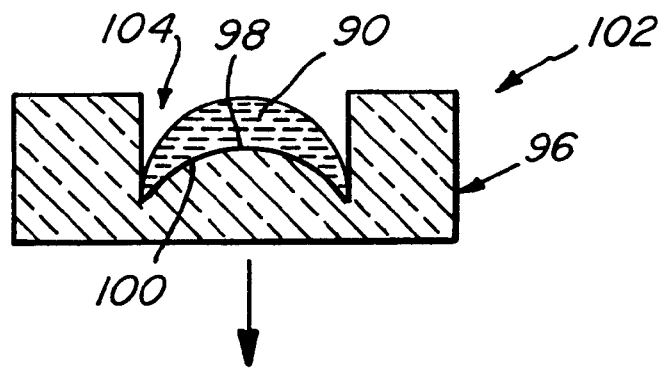

The method and article described above with reference to FIGS. 11*a–f* can be used in conjunction with any optical element having a reflective surface, such as diffraction gratings including holographic gratings, blaze gratings (illustrated in FIGS. 11*a–f*), and the like. For example, a concave mirror can be formed according to one embodiment, and this is described with reference to FIGS. 12*a–d*. At FIG. 12*a* a template 94 having an optical surface 95, for example a glass plano-concave lens, is immersed in a fluid precursor 82, for example polydimethylsiloxane. Precursor 82 is hardened and template 94 is removed, and an article 96 having an optical surface 98 that corresponds to optical 95 of template 94 remains (FIG. 12*b*). Referring to FIG. 12*c*, a liquid metal 90 is placed in contact with optical surface 98 of article 96, thus an optical surface 100 is formed on liquid metal 90, defining an optical element 102. According to one embodiment article 96 is flexible. According to a preferred embodiment article 96 is an elastomer. Article 102 according to this embodiment includes an elastomer 96 including a void 104 having a convex or concave surface (convex surface 100 as illustrated) and a liquid metal 90 adjacent the surface of the void, the liquid metal having an optical surface 100 (a concave mirror surface is illustrated that corresponds to the concave optical surface 95 of template 94).

Optical element 102 can be used to focus electromagnetic radiation directed at optical surface 100 of liquid metal 90 and allowed electromagnetic radiation to reflect from the optical surface. According to an embodiment in which article 96 is flexible, article 96 can be adjusted, thereby adjusting optical surface 100 of liquid metal 90 and adjusting the focus of the electromagnetic radiation. According to a preferred embodiment in which article 96 is an elastomer, this can be done repeatedly.

Figure 12D:
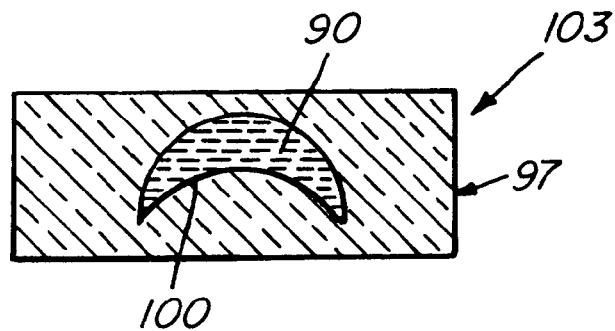

Referring to FIG. 12d, optical element 103 is illustrated. Optical element 103 results from complete encapsulation of liquid metal 90 by article 97, which can be formed by taking steps as described above with respect to FIG. 11f. In the embodiment illustrated in FIG. 11f, liquid metal 90 completely fills void 104 in article 96.

Figure 13:
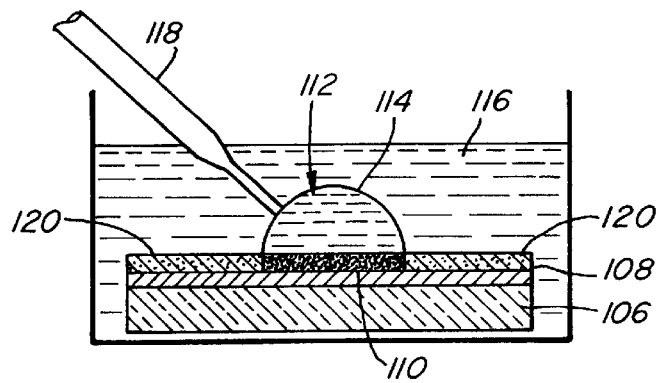
FIG. 13 illustrates a method for forming an optical element in accordance with the invention.

Referring now to FIG. 13, a method of making an optical element is illustrated schematically. The method involves providing a substrate 106 that has, on a surface 108 thereof, a self-assembled monolayer 110 exposing a first chemical functionality. Monolayer 110 is formed in a predetermined shape on surface 108 that corresponds to a shape desired for one portion of the surface of the optical element. A fluid precursor 112 of the optical element then is placed upon monolayer 110, and a surface 114 of fluid precursor 112 is contacted with a fluid 116 that is incompatible with the fluid precursor 112. Alternatively, the incompatible fluid 116 can first be applied to surface 108 of article 106 (and monolayer 110), and fluid precursor 112 then can be applied to monolayer 110, for example using a pipet 118. Portions of surface 108 of article 106 that are not covered with monolayer 110 do not attract fluid precursor 112. If such portions of surface 108 are attractive to fluid precursor 112, a self-assembled monolayer 120 can be formed around self-assembled monolayer 110, isolating monolayer 112, that exposes a chemical functionality that does not attract precursor 112.

When precursor 112 is polydimethylsiloxane that is polymerized to form an optical element that is a plano-convex lens, self-assembled monolayer 110 can be formed from a molecular species terminating in a non-polar functionality, for example hexadecanethiol. In this case, if surface 108 is not sufficiently repulsive of fluid precursor 112, then the remaining portions of surface 108 can be coated with a self-assembled monolayer of a species terminating in a polar functionality, for example a long-chain thiol terminating in a carboxylic acid. This arrangement can be used when surface 108 is a gold surface. Other combinations of surfaces and functional groups that adhere to surfaces are described in application Ser. No. 08/131,841, and/or are known to those with skill in the art.

Figure 14:
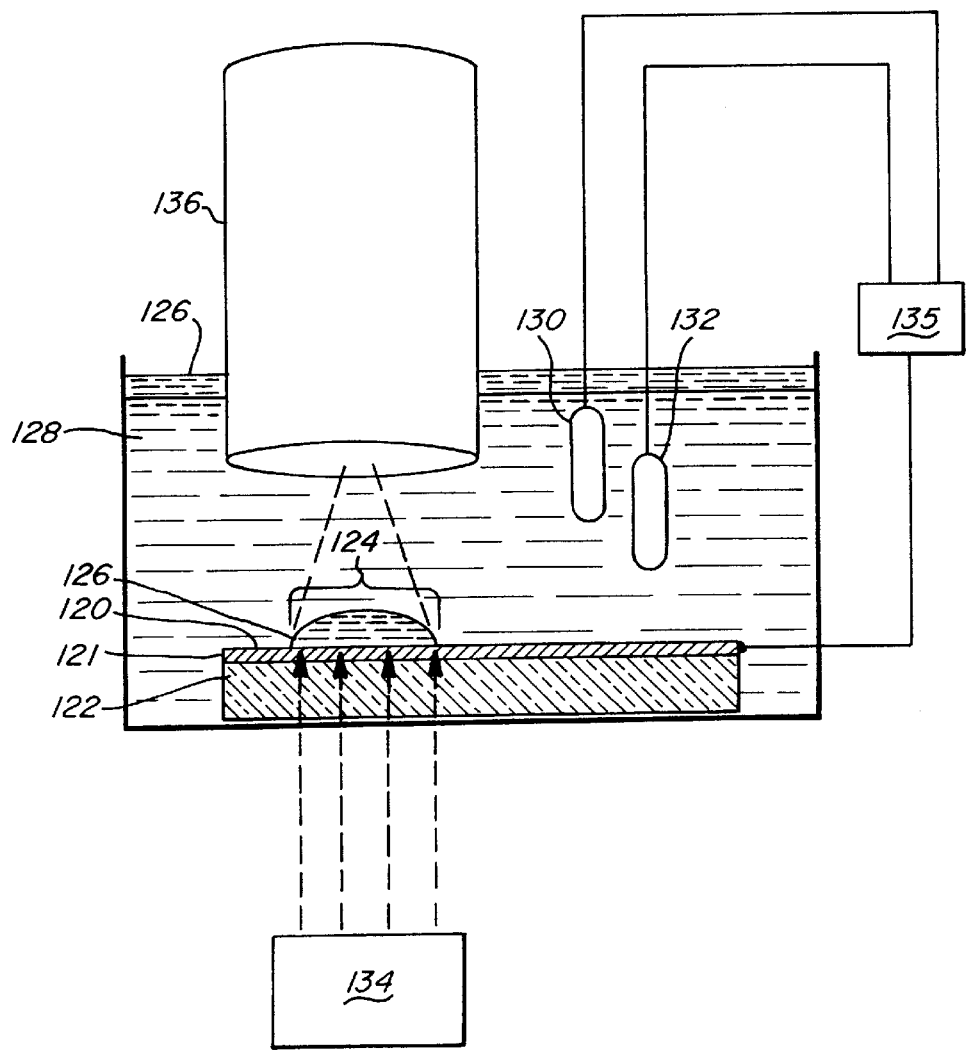
FIG. 14 illustrates apparatus for controlling the shape of a fluid on a surface in accordance with the invention.

The present invention also provides a method for controlling the shape of a liquid, for example a fluid precursor of an optical element. Referring to FIG. 14, the method involves providing a supporting, electrically conductive surface 120. Surface 120 can, for example, be an exposed surface of a thin, transparent gold film 121 on a transparent (e.g. glass) support 122. A self-assembled monolayer is applied to a region 124 of surface 120 and a fluid 126 that is attracted to the chemical functionality exposed by the self-assembled monolayer is applied to the self-assembled monolayer. If surface 120 is not repulsive of fluid 126, then the portion of surface 120 not covered by the self-assembled monolayer can be covered by a self-assembled monolayer exposing a chemical functionality that is repulsive of fluid 126. An electrolyte fluid 128 that is not compatible with fluid 126 is placed over fluid 126, and an electrical circuit including surface 120 and electrolyte 128 is arranged. For example, a reference electrode 130 and a counter electrode 132 can be immersed in electrolyte 128, and surface 120 can define a working electrode, the working, counter, and reference electrodes being controlled by potentiostat 135. By altering the electrical potential at surface 120, the contact angle formed by liquid 126 at surface 120 changes. The change in contact angle is dependent upon the electrical potential. According to one embodiment, the self-assembled monolayer at region 124 is caused to desorb and resorb, during change in electrical potential, at the outermost point of contact between fluid 126 and the surface selectively, and this causes the contact angle between the fluid and the surface to change.

In this way, liquid 126 can be used as a lens that can be focused depending on the electrical potential of surface 120 relative to reference electrode 130. A source of electromagnetic radiation 134 can direct electromagnetic radiation at fluid 126, which electromagnetic radiation can be focused and utilized by a sensor or other electromagnetic radiation-receiving apparatus 136. If fluid 126 is a hardenable fluid, it can serve as a precursor of a solid lens, and adjusting the electrical potential between surface 120 and reference electrode 130 can adjust the focal length of fluid 126, followed by hardening of fluid 126 to produce a lens 126 having a focal length that has been set by adjusting the potential at surface 120 during lens formation. Hardenable fluids useful as fluid 126 include those described above with respect to formation of microstamps and optical elements, and include generally any hardenable fluid that is incompatible with a suitable electrolyte, and that can be placed upon an exposed surface of a self-assembled monolayer.

When a self-assembled monolayer exposes a redox functionality, the species that forms the spacer portion of the self-assembled monolayer-forming species can advantageously be selected as one that has a reasonably good electron transfer function, for example polyenes, poly-ynes, polyaromatics, and the like can be selected.

According to another embodiment, region 124 of surface 120 (or the entire surface 120) is covered with a self-assembled monolayer exposing a redox functionality. Examples of suitable redox functionalities include ferrocene, quinone, thiophene, pyrrole, and the like. The redox state of the exposed chemical functionality of the self-assembled monolayer can be controlled, which can control the contact angle of a fluid 126 at the surface of the self-assembled monolayer.

While the arrangement in FIG. 14 involves an electrolyte contacting surface 120, surrounding fluid 126, and contacting the working and reference electrodes, according to an embodiment in which fluid 126 is an electrolyte, the working and counter electrodes can contact fluid 126 directly. In this embodiment, electrolyte 128 is not necessary if not needed to aid in the formation of the shape of fluid 126.

In the embodiment described with reference to FIG. 14, where fluid 126 is an organic fluid, it may be conveniently applied to region 124 of surface 120 as follows: an aqueous fluid 128 is prepared, and a layer of organic fluid 126 is placed on top of aqueous solution 128. Article 122 is passed through the layer of organic fluid 126, whereupon some of fluid 126 adheres to region 124 of surface 120, and into aqueous solution 128.

In FIG. 14, one article only is formed from fluid 126. However, a plurality of articles on a plurality of isolated regions of surface 120 can be fabricated, and/or used as individual optical elements as illustrated.

According to another embodiment similar to that illustrated in FIG. 14, a plurality of articles are formed on a surface 120 without the use of electrochemistry. A self-assembled monolayer including an isolated region exposing a particular chemical functionality, or an isolated region of a self-assembled monolayer exposing a chemical functionality surrounded by a surface free of self-assembled monolayer, can be passed through an organic fluid layer 126 on top of an aqueous layer 128, whereupon portions of fluid 126 adhere to compatible portions of the self-assembled monolayer, as illustrated in FIG. 14. Fluid 126 can then be hardened, for example via curing, under an aqueous solution, or the article can be removed and fluid regions 126 can be cured.

Figure 15A:
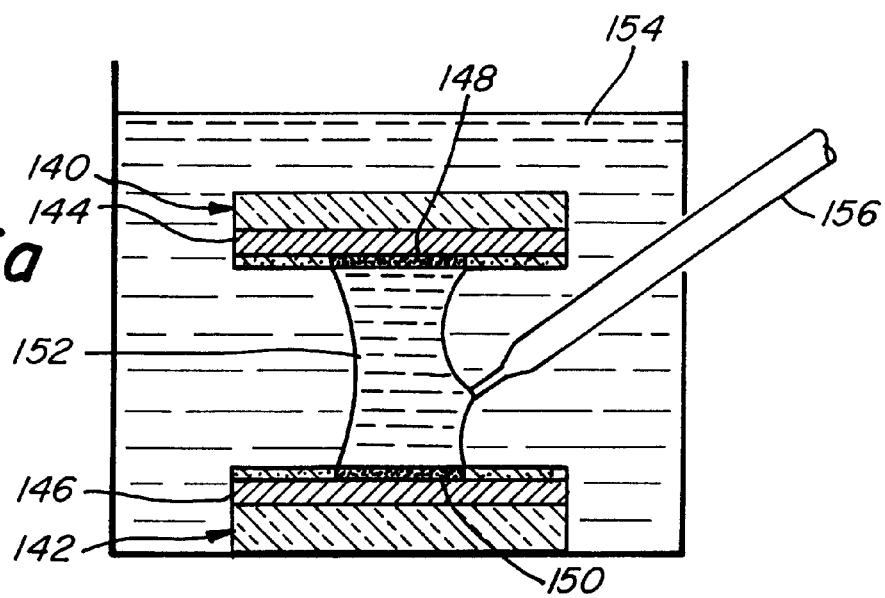
FIGS. 15a and 15b illustrate apparatus for controlling the shape of a fluid on two surfaces in accordance with the invention.
Figure 15B:
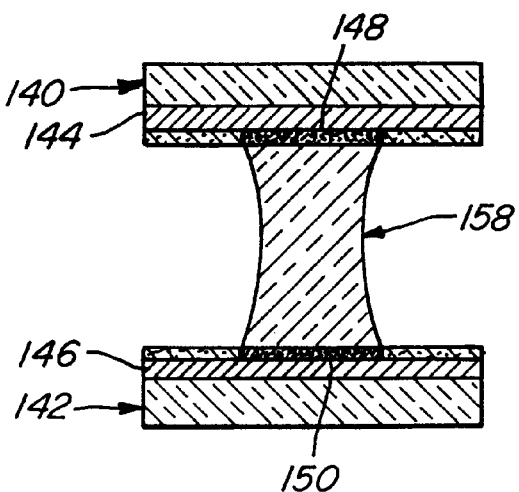

The present invention also provides a method of forming an article that includes providing a precursor of the article in contact with at least two discreet self-assembled monolayer regions. Referring to FIGS. 15a and 15b, a first article 140 and a second article 142 are illustrated schematically. Article 140 includes a thin layer of a conductive species 144 on one of its surfaces and article 142 includes a thin layer of a conductive species 146 on one of its surfaces. Articles 140 and 142, including conductive layers 144 and 146 can be identical. On the surface of conductive layers 144 and 146, respectively, it is a first region 148 and a second region 150 of a self-assembled monolayer exposing a first chemical functionality. The remaining portions of the surface of conductive layers 144 and 146 remain free of self-assembled monolayer, or are covered with a self-assembled monolayer exposing a chemical functionality different from the first chemical functionality. A fluid 152 is caused to contact both self-assembled monolayer 148 and 150. Fluid 152 is compatible with the first chemical functionality exposed by self-assembled monolayers 148 and 150. Fluid 152 is surrounded by fluid 154, which is incompatible with fluid 152. Fluid 154 can be applied to fluid 152 after fluid 152 is applied to self-assembled monolayers 148 and 150, or fluid 152 can be applied to self-assembled monolayers 148 and 150 under fluid 154, for example using pipette 156. If fluid 152 is a hardenable fluid, for example, a precursor of a solvent polymer, it can be cured to form article 158. Article 158 can be removed from self-assembled 148 and 150. According to an alternate embodiment, conductive layers 144 and 146 are not present.

According to one embodiment, electrochemical apparatus as illustrated in FIG. 14 (not shown in FIGS. 15a and b) is provided to adjust the electrical potential of conducting layers 144 and 146. Conducting layers 144 and 146 can be adjusted independently, and thus, the area of contact between fluid 152 and self-assembled monolayers 148 and 150, respectively, can be adjusted.

Figure 16A:
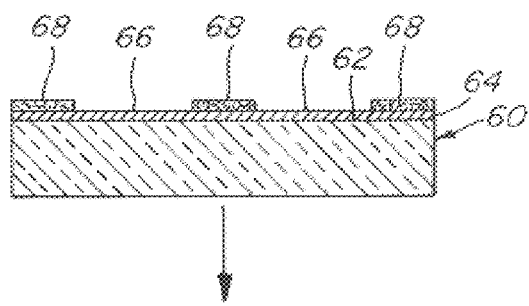
FIGS. 16a–e illustrate a method of etching an article in accordance with one embodiment of the invention.
Figure 16B:
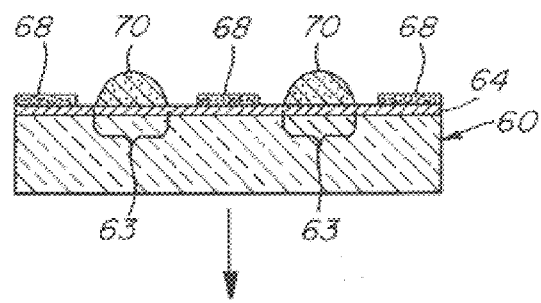

FIGS. 16a–e illustrate schematically a process for etching an article that is similar to the process described in connection with FIGS. 8a–d, with like numerals referring to corresponding components. An article 60, for example silicon, includes, on its surface 62, a layer 64 that can be a thermally-formed layer of silicon dioxide having a surface 66. A self-assembled monolayer 68 (for example alkyl siloxane) is patterned onto surface 66, using any method described herein or other method known to those of skill in the art. Referring to FIG. 16b, a protecting species 70 is added. While in FIGS. 8a–d protecting species 70 is selected to be compatible with the self-assembled monolayer and relatively incompatible with the surface 66 of the layer of silicon dioxide 64, in the embodiment illustrated in FIGS. 16a–e protecting species 70 is more compatible with surface 66 than with self-assembled monolayer 68. The protecting species can be a liquid, a polymerizable species, or the like. The compatibility of the protecting species with the self-assembled monolayer or with the surface 66 can be selected and/or adjusted by those of ordinary skill in the art.

Figure 16C:
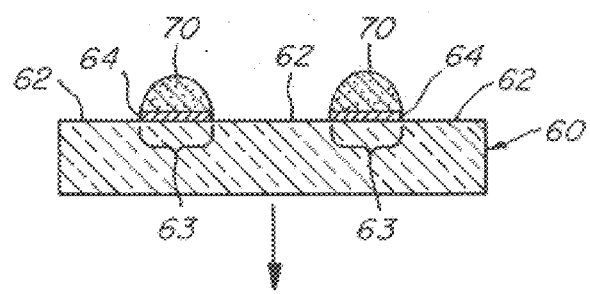
Figure 16D:
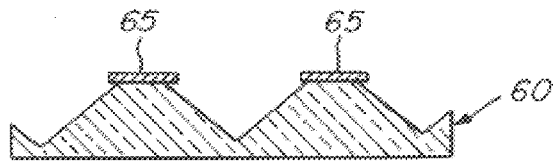
Figure 16E:
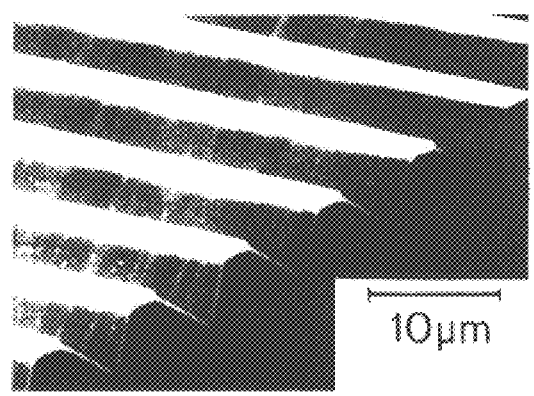

FIG. 16c illustrates the arrangement after application of an etchant to the surface. Portions 63 of layer 64 of silicon dioxide that are protected by protecting species 70 remain on surface 62 of article 60 as mask 65. Remaining portions of layer 64 are etched by the etchant. The etchant and protecting species 70 are selected so as to be incompatible and protecting species 70 thereby protects portions 63 that define mask 65. Subsequently, a silicon etch as described above is added, and silicon dioxide mask 65 acts as a resist for the silicon etch. An exemplary process is described in greater detail below in Example 3, and a photocopy of a scanning electron micrograph (SEM) of a resultant etched surface is shown in FIG. 16e.

In all of the embodiments described and illustrated herein, methods and devices described in accordance with one embodiment can be utilized with any other embodiment where feasible. For example, the controlled spreading described with reference to FIGS. 1a–d can be used in conjunction the stamp deformation as described with reference to FIGS. 3a–c, and these embodiments together or alone can be used for methods and devices discussed with reference to other figures, where feasible. For example, stamp deformation can be used on nonplanar surfaces, controlled spreading can be used in etching as described with reference to FIGS. 8a–d, with lithographic molding as in FIGS. 9a–f, etc. As another example, articles provided in accordance with the inention, especially articles that are diffraction gratings, optical element encapsulants, microstamps, lenses, and the like, all can be fabricated from material or precursors from which others are fabricated, and/or from material described in U.S. Pat. No. 5,512,131. Many of these articles are tranparent polymers, elastomers, and the like, and these materials are known to those of skill in the art.

In all of the embodiments described and illustrated herein, self-assembled monolayers that expose a variety of chemical functionalities can be formed. Hydrophobic, hydrophilic, cytophobic, cytophilic, and other functionalities are described in U.S. Pat. No. 5,512,131, and the following references, all incorporated herein:

Co-pending, commonly-owned U.S. Pat. No. 5,512,131, entitled "Molecular Recognition at Surfaces Derivatized with Self-Assembled Monolayers", by Bamdad, et al.;

"Controlled outgrowth of dissociated neurons on patterned substrates", Kleinfeld, et al, *Journal of Neuroscience*, 8(11): 4098 (1988);

"Growth Control in Miniclones of Human Glial Cells", Westermark, B. *Experimental Cell Research*, 111, 295–299 (1978);

"Micropatterned Substratum Adhesiveness: a Model for Morphogenetic Cues Controlling Cell Behavior" Britland, S., et al *Experimental Cell Research*, 198, 124–129 (1992);

"Engineering Cell Shape and Function", Singhvi, R., et al. *Science*. 264, 696 (1994);

"Convenient Methods of Patterning the Adhesion of Mammalian Cells to Surfaces Using Self-Assembled Monolayers of Alkane Thiols on Gold", *Journal of the American Chemical Society* 115: 5877–5878 (1993).

In accordance with the teachings in these and other references, those of skill in the art can utilize the surfaces produced in accordance with the invention in a variety of biological, chemical, physical, and analytical arenas.

The function and advantage of these and other embodiments of the present invention will be more fully understood from the examples below. The following examples are intended to illustrate the benefits of the present invention, but do not exemplify the full scope of the invention.

EXAMPLE 1
Fabrication of a Microprinting Stamp a polydimethyl siloxane stamp was fabricated. Sylgard 184 silicone elastomer, parts "a" and "B" (10, 1 by weight Dow Corning) were mixed in a plastic cup; trapped air was removed under vacuum. The mixture was poured over a master as described by Kumar, et al., *Langmuir*, 10, 1498–1511 (1994). The master was held in a polystyrene petri dish and left at room temperature for approximately two hours. It was cured by heating in an oven at 60° C. for approximately two hours.

EXAMPLE 2
Controlled Reactive Spreading of a Self-Assembled Monolayer on a Surface Hexadecanethiol was selected as species 27 and was purified by chromatography through silica gel in ethanol with concentrations from 0.014 mM to 6.5 mM. Gold films on silicon were prepared by electron beam sputtering. A piece of gold substrate was put into a polystyrene petri dish that was half-filled with deionized water, and the stamp including species 27 applied to surface 22 was brought into contact with the gold surface. To avoid smearing the gold surface with the stamp, one of two methods were employed. According to the first, the stamp and the gold substrate were taken out of the water together while still in contact, carefully dried in a stream of nitrogen, and then separated. According to the second, the stamp was separated from the gold substrate while under water. The water was replaced with several volumes of clean water to remove any residual species 27 (alkanethiol) and the gold substrate then was removed from water and dried in a stream of nitrogen. Each time the stamp was re-used, it was first rinsed with excess ethanol to remove alkanethiol. Gold was removed from the surface of the silicon article using a cyanide solution (KCN) 0.1 M; KOH: 1 M) with vigorous stirring using air (oxygen) as an oxidant.

EXAMPLE 3 a process for etching silicon is described. The process is described with reference to FIGS. 16a–e. A silicon wafer (<100>orientation) covered with 0.2 micron-thick thermal silicon dioxide (used as received from MEMC) was cleaned in piranha solution (a mixture 7:3 (v/v) of 98% $H_2SO_4$ and 30% $H_2O_2$), thoroughly rinsed with deionized water, and used immediately (Caution: piranha solution is an extremely strong oxidant and should be handled with care. Contact with skin can cause serious injury. Contact with eyes can cause blindness). The surface of the wafer was patterned, using a stamp fabricated in accordance with Example 1, with a self-assembled monolayer of —$Cl_3SiR$, —$(EtO)_3SiR$ (R=—$(CH_2)_3NH_2$, —$(CH_2)_3SH$, —$(CH_2)_3BR$, —$(CH_2)$ NCO, —$(CH_2)_2(CF_2)_5CF_3$, or —$(CH_2)15(CH=CH_2)$ in hexane (ca. 0.4% w/w) for ca. 5 min. Subsequent treatment of the patterned self-assembled monolayers contining vinyl-terminated regions with an aqueous solution of $KMnO_4$ and $KiO_4$ convereted the olefins to carboxylic acids. FIG. 16a illustrates schematically these self-assembled monolayers. A drop of a prepolymer of polymethyl methacrylate (SK-9, Edmund Scientific) or polyurethane (J-91, Edmund Scientifir; NOA81, Norland Products, inc.) was placed on the patterned area. The excess prepolymer was removed by tilting the substrate and allowing the prepolymer to drain off of the surface. The prepolymer was compatible with the chemical functionality exposed by the surface silicon dioxide surface rather than the self-assembled monolayer, thus (FIG. 16b), the prepolymer remaining on the surface selectively wetted regions 63 of silicon dioxide uncovered by self-assembled monolayer 68. The prepolymer was cured under a mercury lamp (medium pressure; the distance between the sample and the lamp was about 1 cm) for about 20 minutes to form protecting species 70 at regions 63 interventing regions covered by self-assembled monolayer 68. The surface was exposed to an etchant, specifically $NH_4F$-buffered aqueous HF solution (250 mL of $H_2O$, 165.5 g of $NH_4F$, and 40 Ml of 48% HF). The etchant was incompatible with the protecting species 70, but removed self-assembled monolayer 68 and the underlying layer of silicon dioxide except at those regions 63 protected by species 70, which served as mask 65 in a subsequent etch of silicon. Anisotropic etching of silicon was carried out in an aqueous solution of KOH and I-PrOH at 70° C. (400 mL of $H_2O$, 92 g of KOH, 132 mL of I-PrOH). This etchant removed the protecting species 70, but not the underlying silicon dioxide mask 65. That is, portions of silicon not protected by mask 65 were anisotropically etched (FIG. 16d). The result is an etched surface of silicon, as represented by the photocopy of the SEM image in FIG. 16e.

Those skilled in the art would readily appreciate that all parameters listed herein are meant to be exemplary and actual parameters will depend upon the specific application for which the methods and apparatus of the present invention are being used. It is, therefore, to be understood that the foregoing embodiments are presented by way of example only and that, within the scope of the appended claims and equivalents thereto, the invention may be practiced otherwise than as specifically described.

What is claimed is:

1. A device comprising:
an article defining a nonplanar surface; and an isolated region of a self-assembled monolayer of a molecular species on the nonplanar surface, the isolated region including a lateral dimension of less than 10 microns.

2. A device as in claim 1, wherein the isolated region includes a lateral dimension of less than 5 microns.

3. A device as in claim 1, wherein the isolated region includes a lateral dimension of less than 2 microns.

4. A device as in claim 1, wherein the isolated region includes a lateral dimension of less than 0.5 micron.

5. A device as in claim 4, further comprising a stamp having a stamping surface, in contact with the nonplanar surface, able to direct formation of the pattern.

6. A device as in claim 5, wherein the stamp includes an elastomeric stamping surface.

7. A device as in claim 5, wherein the stamping surface defines protrusions of a contoured surface including protrusions and intervening indentations.

8. A device as in claim 7, wherein the stamp includes an elastomeric stamping surface.

9. A device as in claim 4, further comprising a stamp having a stamping surface, in contact with the surface of the article, able to direct formation of the pattern.

10. A device as in claim 1, wherein the isolated region pattern includes a lateral dimension of less than 0.1 micron.

11. A device as in claim 10, further comprising a stamp having a stamping surface, in contact with the nonplanar surface, able to direct formation of the pattern.

12. A device as in claim 11, wherein the stamp includes an elastomeric stamping surface.

13. A device as in claim 11, wherein the stamping surface defines protrusions of a contoured surface including protrusions and intervening indentations.

14. A device as in claim 13, wherein the stamp includes an elastomeric stamping surface.

15. A device as in claim 1, included in a combination further comprising a stamp having a stamping surface, in contact with the nonplanar surface, able to direct formation of the pattern.

16. A device as in claim 15, wherein the stamp includes an elastomeric stamping surface.

17. A device as in claim 15, wherein the stamping surface defines protrusions of a contoured surface including protrusions and intervening indentations.

18. A device as in claim 17, wherein the stamp includes an elastomeric stamping surface.

19. A device as in claim 1, wherein the surface is of material selected from the group consisting of silicon, titanium, zirconium, germanium, aluminum, copper, oxides of these or glass.

20. An article as in claim 1, wherein the surface is of a material selected from the group consisting of gold, silver, nickel, cadmium, zinc, palladium, platinum, iron, chromium, alloys of these or alloys of copper.

21. A device as in claim 1, comprising a plurality of isolated regions of a self-assembled monolayer of a molecular species on the surface.

22. A device as in claim 21, wherein the plurality of isolated regions are essentially identical to each other.

23. An article as in claim 22, wherein the isolated regions of the self-assembled monolayer expose a first chemical functionality, and are surrounded by a self-assembled monolayer exposing a second different chemical functionality.

24. A device as in claim 23, wherein the first chemical functionality is hydrophilic and the second chemical functionality is hydrophobic.

25. A device as in claim 24, wherein the first chemical functionality is hydrophobic and the second chemical functionality is hydrophilic.

26. A device as in claim 1, wherein the isolated region covers a rectangular portion of the surface.

27. A device as in claim 1, comprising a plurality of isolated regions of the self-assembled monolayer on the surface, the plurality of regions defining an ordered array of rectangular regions of the surface.

28. A device as claim 27, comprising a plurality of isolated regions of the self-assembled monolayer on the surface, the plurality of regions defining an ordered array of square regions of the surface.

29. A device as in claim 1, wherein the isolated region, together with other self-assembled monolayer features on the surface, defines a gap of lateral dimension less than 10 microns.

30. A device as in claim 1, wherein the isolated region defines a pattern including a lateral dimension of less than 0.25 microns.

31. An article defining a surface able to support a self-assembled monolayer of a molecular species on the surface, included in a combination further comprising a stamp having a surface, in contact with the surface of the article, able to direct formation of a pattern of the self-assembled monolayer of the molecular species on the surface, the pattern including a lateral dimension of less than 10 microns.

32. An article as in claim 31, the isolated region defining a pattern including a lateral dimension of less than 5 microns.

33. An article as in claim 31, the isolated region defining a pattern including a lateral dimension of less than 2 microns.

34. An article as in claim 31, the isolated region defining a pattern including a lateral dimension of less than 0.5 micron.

35. An article as in claim 31, the isolated region defining a pattern including a lateral dimension of less than 0.1 micron.

36. An article as in claim 31, wherein the stamp has an elastomeric stamping surface.

37. An article as in claim 31, wherein the stamping surface defines protrusions of a contoured surface including protrusions and intervening indentations.

38. An article as in claim 31, wherein the isolated regions of the self-assembled monolayer expose a first chemical functionality, and are surrounded by a self-assembled monolayer exposing a second, different chemical functionality.

39. An article as in claim 38, wherein the first chemical functionality is hydrophilic and the second chemical functionality is hydrophobic.

40. An article as in claim 38, wherein the first chemical functionality is hydrophobic and the second chemical functionality is hydrophilic.

41. An article defining a surface; and
a self-assembled monolayer of a molecular species on the surface defining a pattern, the pattern corresponding to a pattern of a stamping surface able to direct formation of the pattern of the self-assembled monolayer of the molecular species on the surface.

* * * * *

UNITED STATES PATENT AND TRADEMARK OFFICE
CERTIFICATE OF CORRECTION

PATENT NO. : 6,180,239 B1
DATED : January 30, 2001
INVENTOR(S) : Whitesides et al.

It is certified that error appears in the above-identified patent and that said Letters Patent is hereby corrected as shown below:

<u>Column 24, claim 10,</u>
Line 59, please delete the word "pattern."

Signed and Sealed this

Sixth Day of November, 2001

Attest:

NICHOLAS P. GODICI
*Attesting Officer*     *Acting Director of the United States Patent and Trademark Office*